(12) United States Patent
Jung et al.

(10) Patent No.: US 11,915,624 B2
(45) Date of Patent: Feb. 27, 2024

(54) STRETCHABLE DISPLAY DEVICE

(71) Applicant: LG Display Co., Ltd., Seoul (KR)

(72) Inventors: Hyunju Jung, Seoul (KR); Eunah Kim, Seosan-si (KR)

(73) Assignee: LG Display Co., Ltd., Seoul (KR)

( * ) Notice: Subject to any disclaimer, the term of this patent is extended or adjusted under 35 U.S.C. 154(b) by 86 days.

(21) Appl. No.: 16/998,617

(22) Filed: Aug. 20, 2020

(65) Prior Publication Data

US 2021/0056873 A1 Feb. 25, 2021

(30) Foreign Application Priority Data

Aug. 23, 2019 (KR) ........................ 10-2019-0103892

(51) Int. Cl.
*G09F 9/30* (2006.01)
*H10K 59/121* (2023.01)
*H10K 59/122* (2023.01)
*H10K 59/131* (2023.01)

(52) U.S. Cl.
CPC .......... *G09F 9/301* (2013.01); *H10K 59/121* (2023.02); *H10K 59/122* (2023.02); *H10K 59/131* (2023.02)

(58) Field of Classification Search
CPC ............ H01L 27/3276; H01L 27/3246; H01L 27/326; G09F 9/301; Y02E 10/549; H10K 59/121; H10K 59/122; H10K 59/131

See application file for complete search history.

(56) References Cited

U.S. PATENT DOCUMENTS

| | | | |
|---|---|---|---|
| 9,391,286 B1* | 7/2016 | Kwon | H10K 59/805 |
| 11,251,237 B2 | 2/2022 | Sun et al. | |
| 2002/0094701 A1* | 7/2002 | Biegelsen | B25J 13/084 439/32 |
| 2014/0299362 A1* | 10/2014 | Park | H05K 1/0283 174/254 |
| 2017/0005077 A1* | 1/2017 | Kim | G02B 6/0041 |
| 2017/0181277 A1* | 6/2017 | Tomita | H05K 1/0283 |
| 2017/0294610 A1 | 10/2017 | Sasaki | |
| 2018/0046221 A1* | 2/2018 | Choi | H05B 33/22 |
| 2018/0053906 A1* | 2/2018 | Lee | H10K 50/844 |
| 2019/0341433 A1* | 11/2019 | Im | H10K 59/131 |
| 2020/0074923 A1* | 3/2020 | Zhou | H10K 77/111 |
| 2021/0225961 A1* | 7/2021 | Sun | H10K 71/00 |

FOREIGN PATENT DOCUMENTS

CN 109923676 A 6/2019

\* cited by examiner

*Primary Examiner* — Vongsavanh Sengdara
(74) *Attorney, Agent, or Firm* — Seed IP Law Group LLP

(57) ABSTRACT

A stretchable display device includes a plurality of grip areas in which a clamp is disposed, and a buffer area adjacent to the plurality of grip areas are defined; a plurality of pixel substrates which is disposed in the display area to be spaced apart from each other; at least one base substrate which is disposed in each of the plurality of grip areas; a plurality of first connection lines which is disposed in the display area and connects the plurality of pixels formed on the plurality of pixel substrates; a plurality of second connection lines disposed in the grip area; and a plurality of third connection lines which is disposed in the buffer area, connects the plurality of first connection lines and the plurality of second connection lines, and has a ductile breaking rate higher than that of the plurality of first connection lines.

29 Claims, 16 Drawing Sheets

STRETCHABLE DISPLAY DEVICE

CROSS-REFERENCE TO RELATED APPLICATION

This application claims the priority of Korean Patent Application No. 10-2019-0103892 filed on Aug. 23, 2019, in the Korean Intellectual Property Office, the disclosure of which is incorporated herein by reference.

BACKGROUND

Technical Field

The present disclosure relates to a stretchable display device, and more particularly, to a stretchable display device which is capable of being stretched using a clamp.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Recently, a stretchable display device which is manufactured by forming a display unit and a wiring line on a flexible substrate such as plastic which is a flexible material so as to be stretchable in a specific direction and changed in various forms is getting attention as a next generation display device.

BRIEF SUMMARY

The present disclosure provides a stretchable display device which enhances a rigidity of an area in which a clamp is contacted to reduce or minimize a damage of a display panel which the stretchable display device is stretched using the clamp.

The present disclosure further provides a stretchable display device which configures a buffer area having a high extension rupture rate in the vicinity of an area in which a clamp is contacted to suppress cracks or breakage generated when the stretchable display device is stretched using a clamp.

Technical benefits of the present disclosure are not limited to the above-mentioned benefits, and other benefits, which are not mentioned above, can be clearly understood by those skilled in the art from the following descriptions.

In order to achieved the above-described benefits, according to an aspect of the present disclosure, a stretchable display device includes a lower substrate in which a display area including a plurality of pixels, a plurality of grip areas in which a clamp is disposed, and a buffer area adjacent to the plurality of grip areas are defined; a plurality of pixel substrates which is disposed in the display area to be spaced apart from each other; at least one base substrate which is disposed in each of the plurality of grip areas; a plurality of first connection lines which is disposed in the display area and connects the plurality of pixels formed on the plurality of pixel substrates; a plurality of second connection lines disposed in the grip area; and a plurality of third connection lines which is disposed in the buffer area, connects the plurality of first connection lines and the plurality of second connection lines, and has a ductile breaking rate higher than that of the plurality of first connection lines.

According to another aspect of the present disclosure, a stretchable display device may include a soft substrate in which a display area including a plurality of pixels, a plurality of grip areas in which a clamp is contacted, and a plurality of buffer areas which encloses each of the plurality of grip areas are defined; at least one rigid substrate which is disposed in each of the plurality of grip areas; and at least one rigid layer which overlaps at least one rigid substrate.

According to still another aspect of the present disclosure, a stretchable display device may include a lower substrate in which a display area including a plurality of pixels, a non-display area adjacent to the display area, and a grip area are defined; in which the grip area overlaps the display area and a part of the non-display area and in the grip area, at least one base substrate and at least one rigid layer which overlaps the base substrate are included.

Other detailed matters of the embodiments are included in the detailed description and the drawings.

According to the present disclosure, when the stretchable display device is stretched, a stretching stress in the vicinity of an area where a clamp is disposed may be reduced.

According to the present disclosure, in the stretchable display device, a connection line may be protected from an external force by the clamp.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
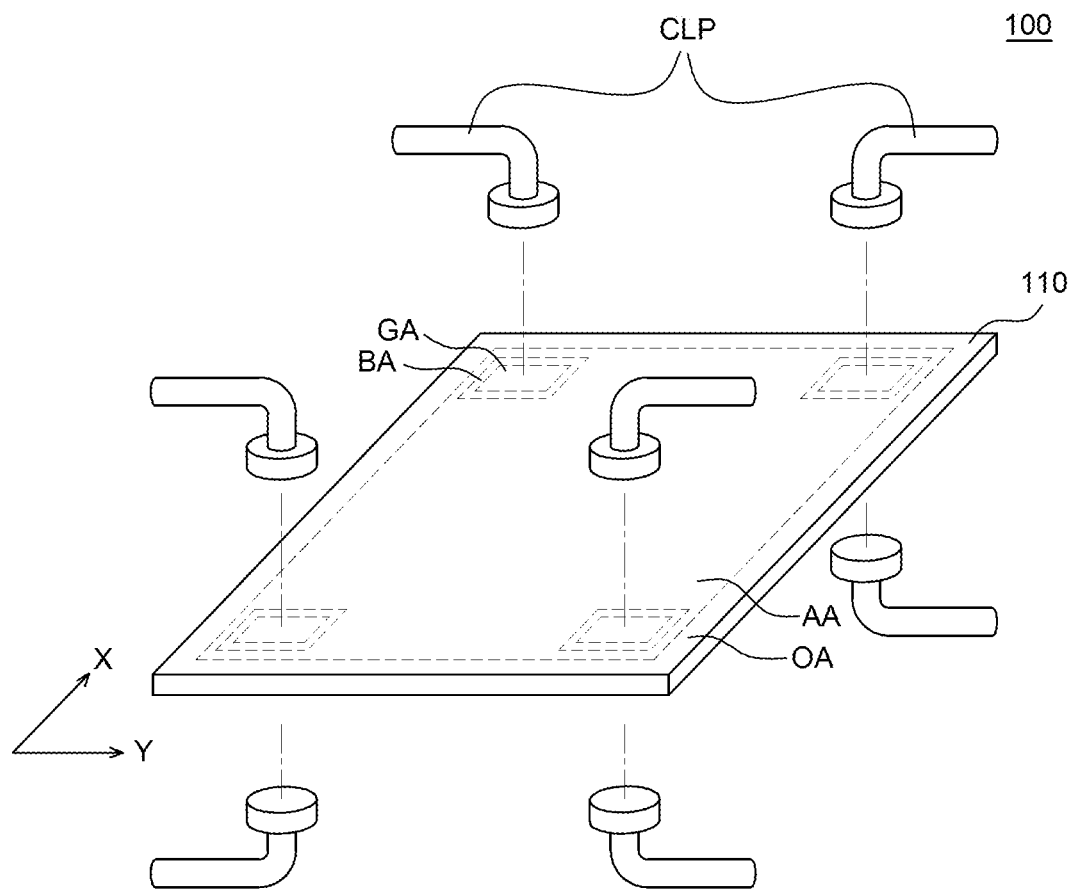
FIG. 1 is a perspective view of a stretchable display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to embodiments of the present disclosure will be described in detail with reference to accompanying drawings.

Stretchable Display Device

A stretchable display device may be referred to as a display device which is capable of displaying images even though the display device is bent, folded, extended, expanded, or stretched. The stretchable display device may have a high flexibility, pliability as compared with a general display device of the related art. Therefore, a shape of a stretchable display device may be freely changed in accordance with manipulation of a user to bend or stretch a stretchable display device. For example, when the user holds ends of the stretchable display device to pull the stretchable display device, the stretchable display device may be extended by the force of the user. Alternatively, when the user disposes the stretchable display device on a wall surface which is not flat, the stretchable display device may be disposed to be bent in accordance with the shape of the surface of the wall. Alternatively, when a force applied by the user is removed, the stretchable display device may return to its original shape.

Figure 2:
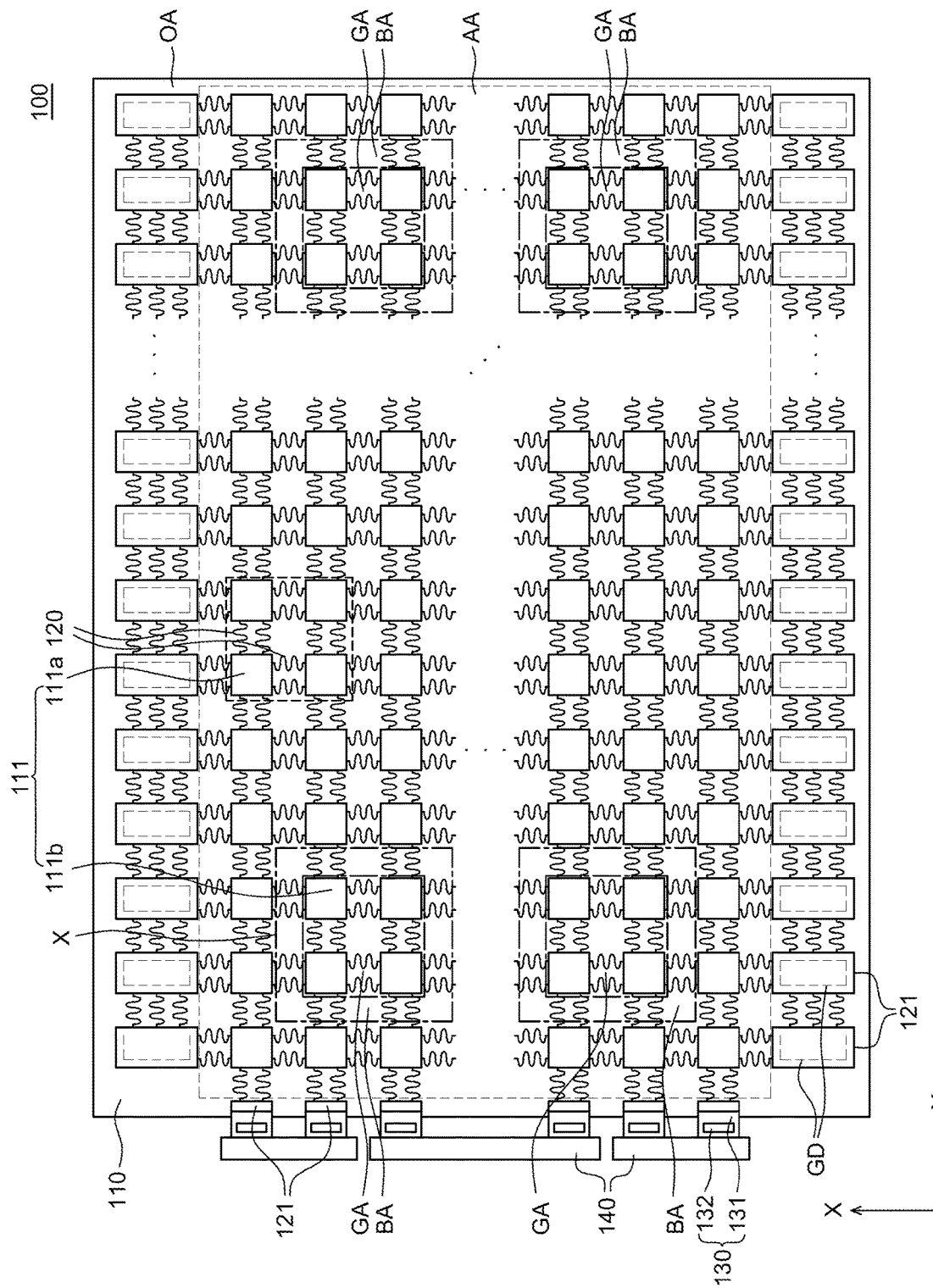
FIG. 2 is a schematic plan view of a stretchable display device according to an embodiment of the present disclosure.

FIG. 1 is a perspective view of a stretchable display device according to an embodiment of the present disclosure. FIG. 2 is a schematic plan view of a stretchable display device according to an embodiment of the present disclosure.

Referring to FIGS. 1 and 2, a stretchable display device 100 includes a lower substrate 110, a plurality of pixel substrates 111a and base substrates 111b, a plurality of connection substrates 120, a plurality of outer peripheral substrates 121, a COF (chip on film) 130, and a printed circuit board 140.

The lower substrate 110 is a substrate which supports and protects several components of the stretchable display device 100. The lower substrate 110 which is a soft substrate may be configured by an insulating material which is bendable or stretchable. For example, the lower substrate 110 may be formed of a silicon rubber such as polydimethylsiloxane (PDMS) or an elastomer such as polyurethane (PU) or polytetrafluoroethylene (PTFE) and thus have a flexible property. However, the material of the lower substrate 110 is not limited thereto.

The lower substrate 110 is a soft substrate so as to be reversibly expanded and contracted. Further, an elastic modulus of the lower substrate 110 may be several MPa to several hundreds of MPa, for example, may be 0.7 MPa to 1 MPa. Further, a ductile breaking rate of the lower substrate 110 may be 100% or higher. Here, the ductile breaking rate refers to an extension distance when an object to be stretched is broken or cracked. That is, the ductile breaking rate is defined as a percentage ratio of a length of an original object and a length of the stretched object when an object has been stretched sufficiently that it is considered broken. For example, if a length of an object (e.g., lower substrate 110) is 100 cm when the object is not stretched and then, it reaches a length of 110 cm when the object has been stretched enough that it becomes broken or cracked at this length, then it was been stretched to 110% of its original length. In this case, the ductile breaking rate of the object is 110%. The number could thus also be called a ductile breaking ratio since it is a ratio of the stretched length as the numerator compared to the original upstretched length as the denominator at the time the break occurs.

The object is considered broken when it cannot longer function properly in the structure or circuit. For example, a wire that is a conductor would be considered broken when there is a sufficient degradation in its ability to carry current that it does not operate within the specifications of the circuit. Thus, in some embodiments, it might not require a full disconnection of the wire for it to be considered broken, a minor stress at a connection ends, a minor crack, a slight shift of the wire's location or other movement that causes it to no longer operate within its expected function would be considered a broken wire. If an insulator is stretched sufficiently that it no longer provides the amount of insulation needed for the structure or circuit, it would be considered broken. Breaking will also include in some embodiments a non-elastic stretching in which the object has been sufficiently stretched that it does not return to its original length and/or shape when it is no longer stretched.

A thickness of the lower substrate 110 may be 10 μm to 1 mm, but is not limited thereto.

The lower substrate 110 may be divided into a display area AA, a grip area GA, a buffer area BA which is adjacent to the grip area GA, and an outer peripheral area OA which is adjacent to the display area AA. In some embodiments, the buffer area BA is enclosed by the grip area GA.

The display area AA is an area in which an image is displayed in the stretchable display device 100 and a display element and various driving elements for driving the display element are disposed in the display area AA. The display area AA may include a plurality of pixels including a plurality of sub pixels. The plurality of pixels is disposed in the display area AA and includes a plurality of display elements. The plurality of sub pixels may be connected to various wiring lines, respectively. For example, each of the plurality of sub pixels may be connected to various wiring lines such as a gate line, a data line, a high potential power line, a low potential power line, and a reference voltage line.

The grip area GA is an area where a clamp CLP which is, for example, a mechanical object stretching the stretchable display device 100 is disposed or in which a body of a user is contacted to stretch the stretchable display device 100.

In order to stretch the stretchable display device 100, a tension needs to be applied to the stretchable display device 100. Therefore, the clamp CLP is in contact (directly or indirectly) with each of the plurality of grip areas GA and the plurality of clamps CLP moves to different directions to apply a tension to the stretchable display device 100.

Alternatively, a part of the body of the user (for example, a hand) is in contact with each of the plurality of grip areas GA and the part of the body moves to different directions to apply a tension to the stretchable display device 100.

The stretchable display device 100 may be stretched to a desired stretching direction by the above-described process.

In FIGS. 1 and 2, it is illustrated that the plurality of grip areas GA is disposed in four corners of the display area AA. However, it is not limited thereto and depending on the necessity of the stretching of the stretchable display device 100, the grip areas GA may be disposed in the outer peripheral area OA and the number of grip areas GA may be also increased.

That is, the grip area GA may overlap only the display area AA or overlap the outer peripheral area OA which is a non-display area or overlap both the display area AA and the outer peripheral area OA.

The buffer area BA refers to an area adjacent to the grip area GA. To be more specific, the buffer area BA may be an area which encloses the grip area GA.

Further, the buffer area BA is an area where a component which reduces a stretching stress generated when the stretching display device 100 is stretched using the plurality of clamps CLP is disposed.

To be more specific, when the stretchable display device 100 is stretched using the clamp CLP disposed in the grip area GA, a stronger stretching stress is concentrated in a peripheral area of the grip area GA. Therefore, the plurality of pixels and various wiring lines disposed in the peripheral area of the grip area GA are highly likely to be cracked or disconnected.

Therefore, the stretchable display device 100 according to the embodiment of the present disclosure may dispose a connection line having a high extension rupture rate in the buffer area BA, to reduce the stretching stress in the buffer area BA adjacent to the grip area GA, which will be described below.

In FIGS. 1 and 2, it is illustrated that the grip areas GA enclose the buffer area BA. However, it is not limited thereto, and the buffer area BA may be modified in various forms to be adjacent to the grip area GA. For example, the buffer area BA may be formed as a plurality of dots disposed to be adjacent to the grip area GA.

The outer peripheral area OA is an area formed at the outer periphery of the display area AA. The outer peripheral area OA is adjacent to the display area AA to enclose the display area AA. The outer peripheral area OA is a non-display area NA in which no image is displayed and wiring lines and circuit units may be formed. For example, a plurality of pads is disposed in the outer peripheral area OA and the pads may be connected to the plurality of sub pixels of the display areas AA, respectively.

On the lower substrate 110, the plurality of pixel substrates 111a and base substrates 111b, and the plurality of outer peripheral substrates 121 are disposed.

The plurality of pixel substrates 111a and base substrates 111b may be disposed in the display area AA and the grip area GA of the lower substrate 110. Specifically, the pixel substrate 111a is disposed in the display area AA and the base substrate 110b is disposed in the grip area GA. Further, the pixel substrates 111a and the base substrates 111b may be formed to have the same or substantially the same shape.

The plurality of outer peripheral substrates 121 may be disposed in the outer peripheral area OA of the lower substrate 110. Even though in FIG. 2, it is illustrated that the plurality of outer peripheral substrates 121 is disposed at an upper side, a lower side, and a left side of the display area AA in the outer peripheral area OA, it is not limited thereto. The plurality of outer peripheral substrates 121 may be disposed in an arbitrary area of the outer peripheral area OA.

The plurality of pixel substrates 111a and base substrates 111b, and the plurality of outer peripheral substrates 121 are rigid substrates and are independently disposed on the lower substrate 110 to be spaced apart from each other. The plurality of pixel substrates 111a and base substrates 111b, and the plurality of outer peripheral substrates 121 may be more rigid than the lower substrate 110. That is, the lower substrate 110 may be softer than the plurality of pixel substrates 111a and base substrates 111b, and the plurality of outer peripheral substrates 121 and the plurality of pixel substrates 111a and base substrates 111b, and the plurality of outer peripheral substrates 121 may be more rigid than the lower substrate 110.

The plurality of pixel substrates 111a and base substrates 111b, and the plurality of outer peripheral substrates 121 which are a plurality of rigid substrates may be formed of a plastic material having flexibility and for example, may be formed of polyimide (PI), polyacrylate, or polyacetate, but is not limited thereto. However, they are not limited thereto and may be formed of a different material. In this case, the plurality of pixel substrates 111a and base substrates 111b, and the plurality of outer peripheral substrates 121 may be formed of the same or substantially the same material, but are not limited thereto and may be formed of different materials.

Moduli of the plurality of pixel substrates 111a and base substrates 111b, and the plurality of outer peripheral substrates 121 may be higher than a modulus of the lower substrate 110. The modulus is an elastic modulus which represents a ratio being deformed by a stress with respect to a stress applied to the substrate. The higher the modulus, the higher a degree of hardness. Therefore, the plurality of pixel substrates 111a and base substrates 111b, and the plurality of outer peripheral substrates 121 may be rigid substrates which are more rigid than the lower substrate 110. Moduli of the plurality of pixel substrates 111a, base substrates 111b, and the plurality of outer peripheral substrates 121 may be 1000 times higher than the modulus of the lower substrate 110, but are not limited thereto.

The COF 130 is a flexible film on which various components are disposed on a base film 131 having a malleability and supplies signals to the plurality of sub pixels of the display area AA. The COF 130 may be bonded to the plurality of pads disposed in the outer peripheral area OA and supply a power voltage, a data voltage, and a gate voltage to the plurality of sub pixels of the display area AA through the pads. The COF 130 includes the base film 131 and a driving IC 132. Further, various components may be additionally disposed thereon.

The base film 131 is a layer which supports the driving IC 132 of the COF 130. The base film 131 may be formed of an insulating material, and for example, may be formed of an insulating material having a flexibility.

The driving IC 132 is a component which processes data for displaying images and a driving signal for processing the data. In FIG. 2, even though it is illustrated that the driving IC 132 is mounted by the COF 130 technique, it is not limited thereto and the driving IC 132 may be mounted by chip on glass (COG) or tape carrier package (TCP).

In FIG. 2, it is illustrated that one outer peripheral substrate 121 is disposed in the outer peripheral area OA at the left side of the display area AA so as to correspond to one row of pixel substrates 111a and base substrates 111b disposed in the display area AA and one COF 130 is disposed for one outer peripheral substrate 121. However, it is not limited thereto. That is, one outer peripheral substrate 121 and one COF 130 may be disposed so as to correspond to a plurality of rows of pixel substrates 111a and base substrates 111b.

A control unit such as an IC chip or a circuit unit may be mounted on the printed circuit board 140. Further, on the printed circuit board 140, a memory or a processor may be mounted. The printed circuit board 140 is a component which transmits a signal for driving the display element from the control unit to the display element. The number of printed circuit boards 140 may vary depending on the necessity for the design.

Hereinafter, the stretchable display device 100 according to the embodiment of the present disclosure will be described in more detail with reference to FIGS. 3 and 4 together.

Planar and Cross-Sectional Structures of Display Area

Figure 3:
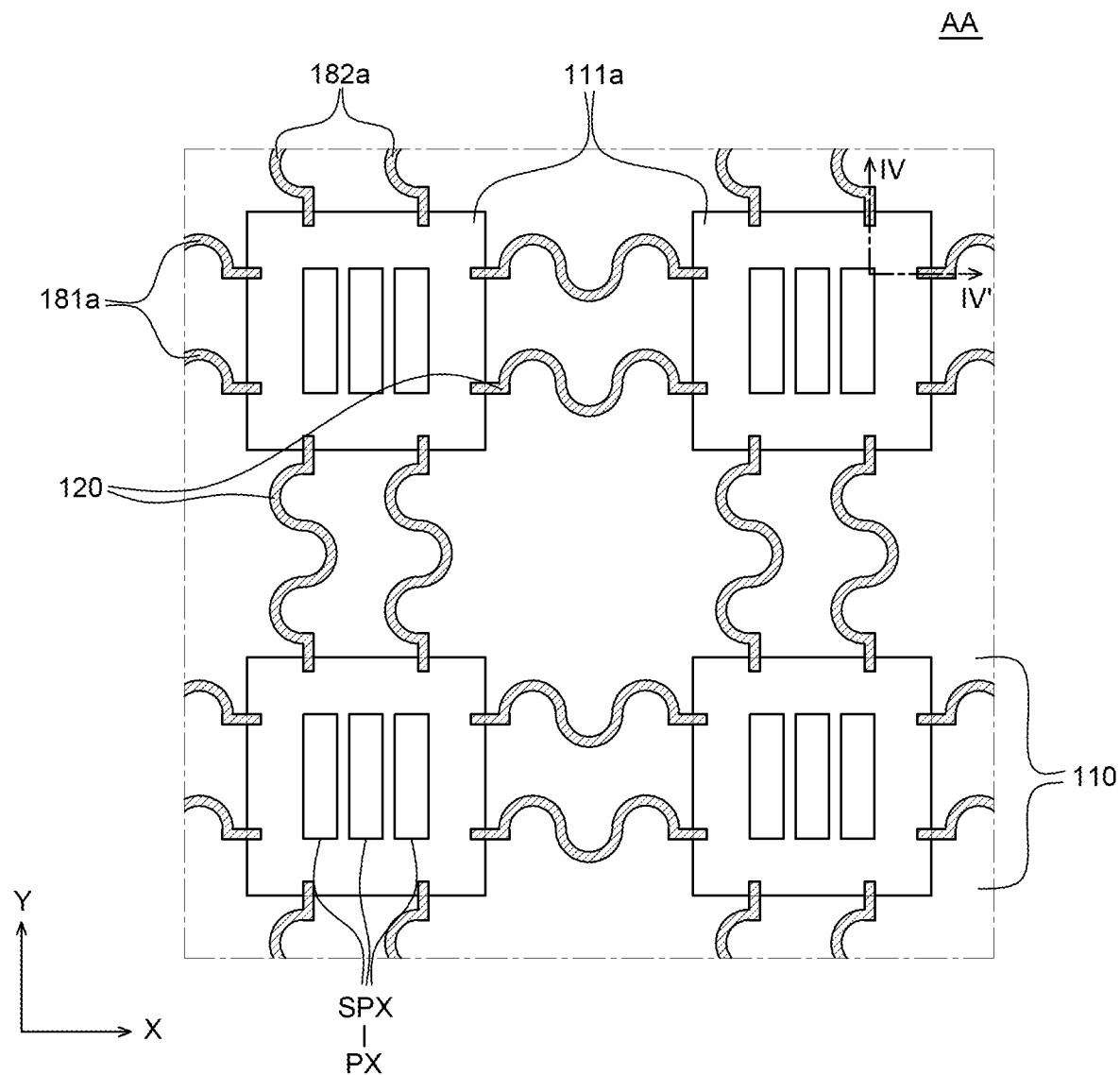
FIG. 3 is a schematic enlarged plan view of a display area of a stretchable display device according to an embodiment of the present disclosure.

FIG. 3 is a schematic enlarged plan view of a display area of a stretchable display device according to an embodiment of the present disclosure. FIG. 4 is a cross-sectional view taken along the line IV-IV' of FIG. 3.

Figure 4:
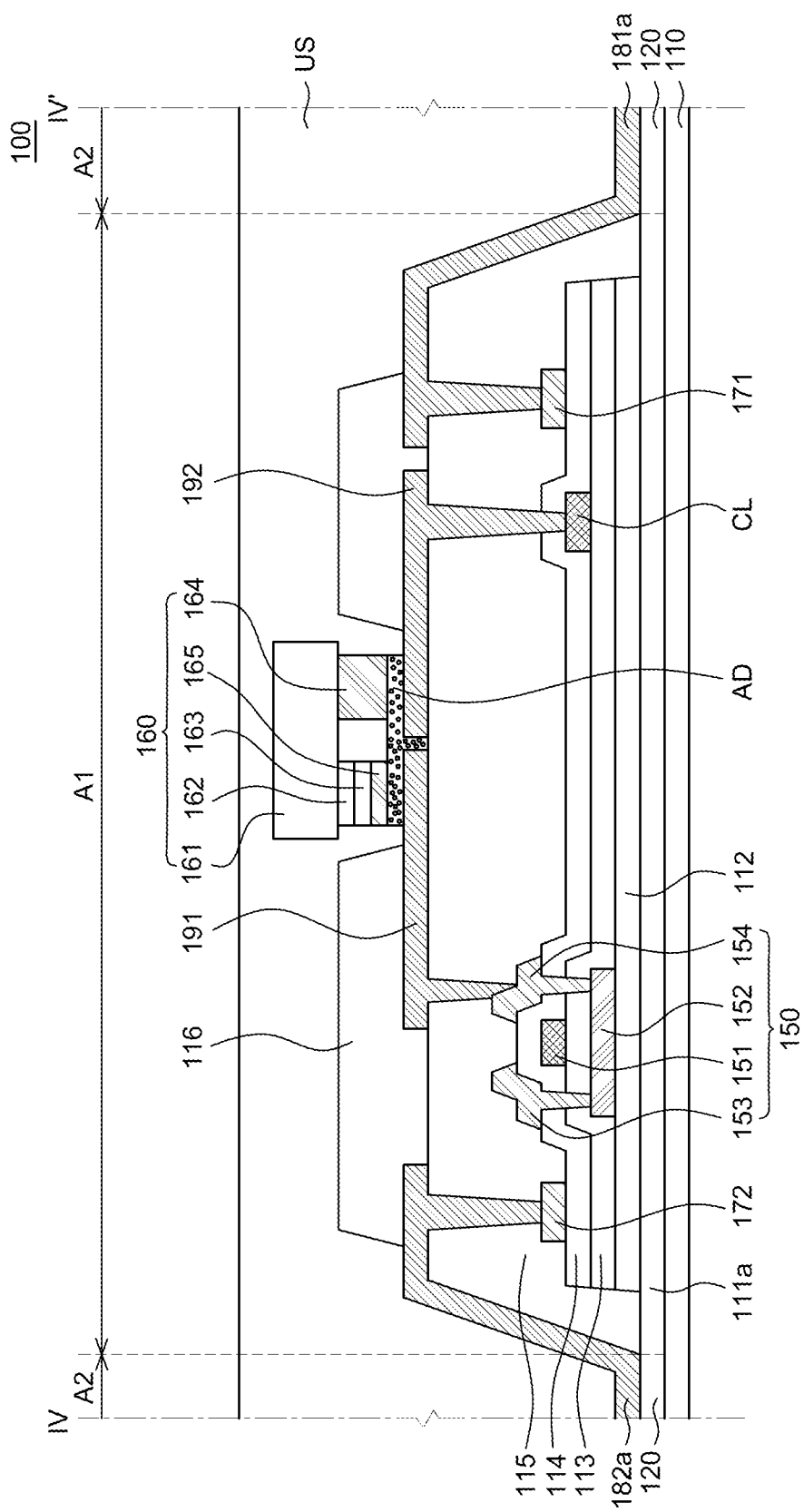
FIG. 4 is a cross-sectional view taken along the line IV-IV' of FIG. 3.

Referring to FIGS. 3 and 4, the plurality of pixel substrates 111a is disposed on the lower substrate 110 in the display area AA. The plurality of pixel substrates 111a is spaced apart from each other to be disposed on the lower substrate 110. For example, as illustrated in FIGS. 2 and 3, the plurality of pixel substrates 111a may be disposed on the lower substrate 110 in a matrix, but is not limited thereto.

Referring to FIGS. 2 and 3, a plurality of sub pixels SPX which configures the plurality of pixels PX is disposed on the plurality of pixel substrates 111a and a gate driver GD may be mounted on the outer peripheral substrate 121 located at an upper side and a lower side of the display area AA, among the plurality of outer peripheral substrates 121. The gate driver GD may be formed on the outer peripheral substrate 121 in a gate in panel (GIP) manner when various elements on the pixel substrate 111a are manufactured. Therefore, various circuit configurations which configure the gate driver GD, such as various transistors, capacitors, and wiring lines may be disposed on the plurality of outer peripheral substrates 121. However, it is not limited thereto and the gate driver GD may be mounted in a chip on film (COF) manner. Further, the plurality of outer peripheral substrates 121 may be disposed only at any one of the upper side and the lower side of the display area AA.

Referring to FIG. 2, a size of the plurality of outer peripheral substrates 121 may be larger than a size of the plurality of pixel substrates 111a. Specifically, a size of each of the plurality of outer peripheral substrates 121 may be larger than a size of each of the plurality of pixel substrates 111a. As described above, on each of the plurality of outer peripheral substrates 121, the gate driver GD is disposed. For example, one stage of the gate driver GD may be disposed on each of the plurality of outer peripheral substrates 121. Therefore, an area occupied by various circuit configurations which configure one stage of the gate driver GD may be relatively larger than an area of the pixel substrate 111a on which the pixel PX is disposed. As a result, a size of each of the plurality of outer peripheral substrates 121 may be larger than a size of each of the plurality of pixel substrates 111a.

Referring to FIGS. 2 and 3, the plurality of connection substrates 120 is disposed between the plurality of pixel substrates 111a, between the plurality of outer peripheral substrates 121, or between the plurality of pixel substrates 111a and the plurality of outer peripheral substrates 121. The plurality of connection substrates 120 is substrates which connect adjacent pixel substrates 111a, adjacent outer peripheral substrates 121, or between the pixel substrates 111a and the outer peripheral substrates 121. The plurality of connection substrates 120 may be simultaneously and integrally formed with the same or substantially the same material as the pixel substrates 111a or the outer peripheral substrate 121, but is not limited thereto.

Referring to FIGS. 2 and 3, the plurality of connection substrates 120 has a wavy shape. For example, as illustrated in FIGS. 2 and 3, the plurality of connection substrates 120 may have a sine wave shape. However, the shape of the plurality of connection substrates 120 is not limited thereto and the plurality of connection substrates 120 may extend with a zigzag pattern or may be formed with various shapes such as a shape extended by connecting a plurality of rhombus-shaped substrates at vertexes. Further, the number and the shape of the plurality of connection substrates 120 illustrated in FIG. 3 are illustrative and the number and the shape of the plurality of connection substrates 120 may vary depending on the design.

Referring to FIG. 4, a buffer layer 112 is disposed on the plurality of pixel substrates 111a. The buffer layer 112 is formed on the plurality of pixel substrates 111a to protect various components of the stretchable display device 100 from permeation of moisture ($H_2O$) and oxygen ($O_2$) from the outside of the lower substrate 110 and the plurality of pixel substrates 111a. The buffer layer 112 may be configured of an insulating material and for example, configured by a single layer or a double layer of an inorganic layer formed of silicon nitride ($SiN_x$), silicon oxide ($SiO_x$), and silicon oxynitride (SiON). However, the buffer layer 112 may be omitted depending on a structure or a characteristic of the stretchable display device 100.

In this case, the buffer layer 112 may be formed only in an area overlapping the plurality of pixel substrates 111a and the plurality of outer peripheral substrates 121. As described above, the buffer layer 112 may be formed of an inorganic material so that the buffer layer 112 may be easily cracked to be damaged during a process of stretching the stretchable display device 100. In this case, the buffer layer 112 is not formed in an area between the plurality of pixel substrates 111a and the plurality of outer peripheral substrates 121, but is patterned to have the shape of the plurality of pixel substrates 111a and the plurality of outer peripheral substrates 121. Therefore, the buffer layer 112 may be formed only on the plurality of pixel substrates 111a and the plurality of outer peripheral substrates 121. Therefore, in the stretchable display device 100 according to the embodiment of the present disclosure, the buffer layer 112 is formed only in an area overlapping the plurality of pixel substrates 111a and the plurality of outer peripheral substrates 121 which are rigid substrates. Therefore, even though the stretchable display device 100 is bent or stretched to be deformed, the damage of the buffer layer 112 may be suppressed.

Referring to FIG. 4, the transistor 150 including a gate electrode 151, an active layer 152, a source electrode 153, and a drain electrode 154 is formed on the buffer layer 112.

First, the active layer 152 is disposed on the buffer layer 112. For example, the active layer 152 may be formed of an oxide semiconductor, amorphous silicon (a-Si), polycrystalline silicon (poly-Si), or an organic semiconductor.

A gate insulating layer 113 is disposed on the active layer 152. The gate insulating layer 113 is a layer for electrically insulating the gate electrode 151 from the active layer 152 and may be formed of an insulating material. For example, the gate insulating layer 113 may be formed as a single layer of silicon nitride (SiNx) or silicon oxide (SiOx) which is an inorganic material or a multi-layer of silicon nitride (SiNx) or silicon oxide (SiOx), but it is not limited thereto.

The gate electrode 151 is disposed on the buffer layer 112. The gate electrode 151 is disposed to overlap the active layer 152. The gate electrode 151 may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

An interlayer insulating layer 114 is disposed on the gate electrode 151. The interlayer insulating layer 114 is a layer which insulates the gate electrode 151 from the source electrode 153 and the drain electrode 154 and is formed of an inorganic material, similarly to the buffer layer 112. For example, the interlayer insulating layer 114 may be formed as a single layer of silicon nitride (SiNx) or silicon oxide (SiOx) which is an inorganic material or a multi-layer of silicon nitride (SiNx) or silicon oxide (SiOx), but it is not limited thereto.

The source electrode 153 and the drain electrode 154 which are in contact with the active layer 152 are disposed on the interlayer insulating layer 114. The source electrode 153 and the drain electrode 154 are disposed on the same layer to be spaced apart from each other. The source electrode 153 and the drain electrode 154 may be in contact with the active layer 152 to be electrically connected to the active layer 152. The source electrode 153 and the drain electrode 154 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

Further, the gate insulating layer 113 and the interlayer insulating layer 114 are patterned to be formed only in an area overlapping the plurality of pixel substrates 111a. The gate insulating layer 113 and the interlayer insulating layer 114 are also formed of the inorganic material, similarly to the buffer layer 112, so that the gate insulating layer 113 and the interlayer insulating layer 114 may also be easily cracked to be damaged during the process of stretching the stretchable display device 100. Therefore, the gate insulating layer 113 and the interlayer insulating layer 114 are not formed in an area between the plurality of pixel substrates 111a, but are patterned to have a shape of the plurality of pixel substrates 111a to be formed only above the plurality of pixel substrates 111a.

In FIG. 4, even though among various transistors which may be included in the stretchable display device 100, only a driving transistor is illustrated for the convenience of description, a switching transistor or a capacitor may also be included in the stretchable display device. Further, in this specification, even though it is described that the transistor 150 has a coplanar structure, various transistors such as a staggered transistor may also be used.

Referring to FIG. 4, a plurality of pads 170 is disposed on the interlayer insulating layer 114. Specifically, a gate pad 171 among the plurality of pads 170 is disposed on the interlayer insulating layer 114. The gate pad 171 is a pad which transmits a gate signal to the plurality of sub pixels SPX. The gate signal may be transmitted to the gate electrode 151 from the gate pad 171 through a gate line formed on the pixel substrate 111a. The gate pad 171 may be formed of the same or substantially the same material as the source electrode 153 and the drain electrode 154, but is not limited thereto.

Referring to FIG. 4, a data pad 172 among the plurality of pads 170 is disposed on the interlayer insulating layer 114. The data pad 172 is a pad which transmits a data signal to the plurality of sub pixels SPX. The data signal may be transmitted to the source electrode 153 or the drain electrode 154 through a data line formed on the pixel substrate 111a from the data pad 172. The data pad 172 may be formed of the same or substantially the same material as the source electrode 153 and the drain electrode 154, but is not limited thereto.

Referring to FIG. 4, a planarization layer 115 is formed on the transistor 150 and the interlayer insulating layer 114. The planarization layer 115 planarizes an upper portion of the transistor 150. The planarization layer 115 may be configured by a single layer or a plurality of layers and may be formed of an organic material. For example, the planarization layer 115 may be formed of an acrylic-based organic material, but is not limited thereto.

Referring to FIG. 4, the planarization layer 115 is disposed on the plurality of pixel substrates 111a to cover top surfaces and side surfaces of the buffer layer 112, the gate insulating layer 113, and the interlayer insulating layer 114. Therefore, the planarization layer 115 encloses the buffer layer 112, the gate insulating layer 113, and the interlayer insulating layer 114 together with the plurality of pixel substrates 111a. Specifically, the planarization layer 115 may be disposed so as to cover a top surface and a side surface of the interlayer insulating layer 114, a side surface of the gate insulating layer 113, a side surface of the buffer layer 112, and a part of a top surface of the plurality of pixel substrates 111a. Therefore, the planarization layer 115 may supplement a step on the side surfaces of the buffer layer 112, the gate insulating layer 113, and the interlayer insulating layer 114 and enhance an adhesive strength of the planarization layer 115 and the connection line 180a disposed on the side surface of the planarization layer 115.

In some embodiments, a passivation layer may be formed between the transistor 150 and the planarization layer 115. That is, the passivation layer may be formed to cover the transistor 150 to protect the transistor 150 from the permeation of the moisture and oxygen. The passivation layer may be formed of an inorganic material and configured by a single layer or a plurality of layers, but is not limited thereto.

Referring to FIG. 4, a common line CL is disposed on the gate insulating layer 113. The common line CL is a wiring line which applies a common voltage to the plurality of sub pixels SPX. The common line CL may be formed of the same or substantially the same material as the gate electrode 151 of the transistor 150, but is not limited thereto.

Referring to FIGS. 3 and 4, a first connection line 180a may refer to a wiring line which electrically connects the pads 170 on the plurality of pixel substrates 111a or the plurality of outer peripheral substrates 121. The first connection lines 180a are disposed on the pixel substrates 111a and the plurality of connection substrates 120.

The first connection line 180a may have a wavy shape to be extended. That is, the first connection line 180a formed on the plurality of connection substrates 120 may have the same or substantially the same shape as the plurality of connection substrates 120. For example, the first connection line 180a may have various shapes such as a sine wave shape, a zigzag pattern, or a shape extended by connecting a plurality of rhombus-shaped substrates at vertexes, similarly to the plurality of connection substrates 120.

The first connection line 180a may be formed of a metal material such as copper (Cu), aluminum (Al), titanium (Ti), and molybdenum or a stacked structure of metal materials such as copper/molybdenum-titanium (Cu/Moti) or titanium/aluminum/titanium (Ti/Al/Ti), but is not limited thereto.

The first connection line 180a includes a first sub connection line 181a and a second sub connection line 182a. The first sub connection line 181a and the second sub connection line 182a are disposed between the plurality of pixel substrates 111a. Specifically, the first sub connection line 181a refers to a wiring line of the first connection lines 180a extending to the X-axis direction between the plurality of pixel substrates 111a. The second sub connection line 182a refers to a wiring line of the first connection lines 180a extending to the Y-axis direction between the plurality of pixel substrates 111a.

In the case of a general organic light emitting display device, various wiring lines such as a plurality of gate lines and a plurality of data lines extend between the plurality of sub pixels with a straight line shape and the plurality of sub pixels is connected to one signal line. Therefore, in the general organic light emitting display device, various wiring lines, such as a gate line, a data line, a high potential power line, and a reference voltage line, extend from one side to the other side of the organic light emitting display device without being disconnected on the substrate.

In contrast, in the stretchable display device 100 according to the embodiment of the present disclosure, various wiring lines such as a gate line, a data line, a high potential power line, or a reference voltage line having a straight line shape which are considered to be used for the general organic light emitting display device may be disposed only on the plurality of pixel substrates 111a, base substrates 111b, and the plurality of outer peripheral substrates 121. That is, in the stretchable display device 100 according to the embodiment of the present disclosure, a straight line shaped wiring line may be disposed only on the plurality of pixel substrates 111a, base substrates 111b, and the plurality of outer peripheral substrates 121.

In the stretchable display device 100 according to the embodiment of the present disclosure, in order to connect discontinuous wiring lines on the pixel substrate 111a or the outer peripheral substrate 121, pads on two adjacent pixel substrates 111a or two adjacent outer peripheral substrates 121 may be connected by the first connection line 180a. That is, the first connection line 180a electrically connects the pads on two adjacent pixel substrates 111a, two adjacent outer peripheral substrates 121, and the pixel substrates 111a and the outer peripheral substrates 121. Accordingly, the stretchable display device 100 according to the embodiment of the present disclosure may include a plurality of first connection lines 180a which electrically connects various wiring lines, such as a gate line, a data line, a high potential power line, and a reference voltage line, between the plurality of pixel substrates 111a, between the plurality of outer peripheral substrates 121, and between the plurality of pixel substrates 111a and the plurality of outer peripheral substrates 121. For example, the gate line may be disposed on the plurality of pixel substrates 111a disposed to be adjacent to each other in the X-axis direction and the gate pad 171 may be disposed on both ends of the gate line. In this case, the plurality of gate pads 171 on the plurality of pixel substrates 111a adjacent to each other in the X-axis direction may be connected to each other by the first sub connection line 181a which serves as a gate line. Therefore, the gate line disposed on the plurality of pixel substrates 111a and the first sub connection line 181a disposed on the outer peripheral substrate 121 may serve as one gate line. Further, wiring lines which extend in the X-axis direction, among all various wiring lines which may be included in the stretchable display device 100 such as an emission signal line, a low potential power line, and a high potential power line, may also be electrically connected by the first sub connection line 181a, as described above.

Referring to FIGS. 3 and 4, the first sub connection line 181a may connect pads on two pixel substrates 111a which are disposed side by side, among pads on the plurality of pixel substrates 111a which is adjacent to each other in the X-axis direction. The first sub connection line 181a may serve as a gate line, an emission signal line, a high potential power line, or a low potential power line, but is not limited thereto. For example, the first sub connection line 181a may serve as a gate line and electrically connect the gate pads 171 on two pixel substrates 111a which are disposed side by side in the X-axis direction. Therefore, as described above, the gate pads 171 on the plurality of pixel substrates 111a disposed in the X-axis direction may be connected by the first sub connection line 181a serving as a gate line and transmit one gate signal.

Referring to FIG. 3, the second sub connection line 182a may connect pads on two pixel substrates 111a which are disposed side by side, among pads on the plurality of pixel substrates 111a which is adjacent to each other in the Y-axis direction. The second sub connection line 182a may serve as a data line, a high potential power line, a low potential power line, or a reference voltage line, but is not limited thereto. For example, the second sub connection line 182a may serve as a data line and electrically connect the data lines on two pixel substrates 111a which are disposed side by side in the Y-axis direction. Therefore, as described above, the data line on the plurality of pixel substrates 111a disposed in the Y-axis direction may be connected by the plurality of second sub connection line 182a serving as a data line and transmit one data signal.

Referring to FIG. 2, the first connection line 180a may further include a wiring line which connects pads on the plurality of pixel substrates 111a and the plurality of outer peripheral substrates 121 or connects pads on two outer peripheral substrates 121 disposed side by side, among pads on the plurality of outer peripheral substrates 121 disposed to be adjacent to each other in the Y-axis direction.

The first sub connection line 181a is formed to extend to a top surface of the connection substrate 120 while being in contact with a top surface and a side surface of the planarization layer 115 disposed on the pixel substrate 111a. Further, the second sub connection line 182a is formed to extend to a top surface of the connection substrate 120 while being in contact with a top surface and a side surface of the planarization layer 115 disposed on the pixel substrate 111a.

Referring to FIG. 4, a bank 116 is formed on the first connection pad 191, the second connection pad 192, the first connection line 180a, and the planarization layer 115. The bank 116 is a component which divides adjacent sub pixels SPX.

The bank 116 is disposed so as to cover a part of the second sub connection line 182a and the first connection pad 191 which are adjacent to each other or at least a part of the first sub connection line 181a and the second connection pad 192. The bank 116 may be formed of an insulating material. Further, the bank 116 may include a black material. The bank 116 includes the black material to block wiring lines which may be visible through the display area AA. For example, the bank 116 may be formed of a transparent carbon-based mixture and specifically, include carbon black. However, it is not limited thereto and the bank 116 may be formed of a transparent insulating material.

Referring to FIG. 4, an LED 160 is disposed on the first connection pad 191 and the second connection pad 192. The LED 160 may be transferred onto the pixel substrate 111a through a transferring process. The LED 160 includes an n-type layer 161, an active layer 162, a p-type layer 163, an n electrode 164, and a p electrode 165. The LED 160 of the stretchable display device 100 according to the embodiment of the present disclosure has a flip-chip structure in which the n electrode 164 and the p electrode 165 are formed on one surface.

The n-type layer 161 may be formed by injecting an n-type impurity into gallium nitride (GaN) having excellent crystallinity. The n-type layer 161 may be disposed on a separate base substrate which is formed of a material which is capable of emitting light.

The active layer 162 is disposed on the n-type layer 161. The active layer 162 is a light emitting layer which emits light in the LED 160 and may be formed of a nitride semiconductor, for example, indium gallium nitride (InGaN). The p-type layer 162 is disposed on the active layer 162. The p-type layer 163 may be formed by injecting a p-type impurity into gallium nitride (GaN).

As described above, the LED 160 according to the embodiment of the present disclosure may be manufactured by sequentially laminating the n-type layer 161, the active layer 162, and the p-type layer 163, and then etching a predetermined part to form the n electrode 164 and the p electrode 165. In this case, the predetermined part is a space for separating the n electrode 164 and the p electrode 165 from each other and the predetermined part may be etched to expose a part of the n-type layer 161. In other words, the surfaces of the LED 160 to dispose the n electrode 164 and the p electrode 165 are not flat surfaces, but have different height levels.

As described above, in the etched area, in other words, on the n-type layer 161 exposed by the etching process, the n electrode 164 is disposed. The n electrode 164 may be formed of a conductive material. In the meantime, in an area which is not etched, in other words, the p electrode 165 is disposed on the p-type layer 163. The p electrode 165 is also formed of a conductive material, for example, may be formed of the same or substantially the same material as the n electrode 164.

An LED adhesive layer AD is disposed on top surfaces of the first connection pad 191 and the second connection pad 192 and between the first connection pad 191 and the second connection pad 192 so that the LED 160 may be bonded onto the first connection pad 191 and the second connection pad 192. In this case, the n electrode 164 may be disposed on the second connection pad 192 and the p electrode 165 may be disposed on the first connection pad 191.

The LED adhesive layer AD may be a conductive adhesive layer in which conductive balls are dispersed in an insulating base member. Therefore, when heat or a pressure is applied to the LED adhesive layer AD, the conductive balls are electrically connected in a portion applied with heat or a pressure to have a conductive property and an area which is not pressurized may have an insulating property. For example, the n electrode 164 is electrically connected to the second sub connection line 182a by means of the LED adhesive layer AD and the p electrode 165 is electrically connected to the first sub connection line 181a by means of the LED adhesive layer AD. That is, after applying the LED adhesive layer AD on the first connection pad 191 and the second connection pad 192 using an inkjet method, the LED 160 is transferred onto the LED adhesive layer AD and the LED 160 is pressurized and heated. By doing this, the first connection pad 191 is electrically connected to the p electrode 165 and the second connection pad 192 is electrically connected to the n electrode 164. However, another part of the LED adhesive layer AD excluding a part of the LED adhesive layer AD disposed between the n electrode 164 and the second connection pad 192 and a part of the LED adhesive layer AD disposed between the p electrode 165 and the first connection pad 191 has an insulating property. In the meantime, the LED adhesive layer AD may be divided to be disposed on the first connection pad 191 and the second connection pad 192, respectively.

As described above, the stretchable display device 100 according to the embodiment of the present disclosure has a structure in which the LED 160 is disposed on the lower substrate 110 on which the transistor 150 is disposed. Therefore, when the stretchable display device 100 is turned on, different voltage levels which are applied to the first connection pad 191 and the second connection pad 192 are transmitted to the n electrode 164 and the p electrode 165 so that the LED 160 emits light.

Referring to FIG. 4, the upper substrate US is disposed on the bank 116, the LED 160, and the lower substrate 110.

The upper substrate US is a substrate which supports various components disposed below the upper substrate US. Specifically, the upper substrate US is formed by coating a material which configures the upper substrate US on the lower substrate 110 and the plurality of pixel substrates 111a and then curing the material to be disposed to be in contact with the lower substrate 110, the plurality of pixel substrate 111a, the plurality of connection substrate 120, and a plurality of third areas A3.

The upper substrate US which is a soft substrate may be configured by an insulating material which is bendable or extendable. The upper substrate US is a soft substrate so as to be reversibly expanded and contracted. Further, an elastic modulus of the upper substrate US may be several MPa to several hundreds of MPa, for example, may be 0.7 MPa to 1 MPa. Further, a ductile breaking rate of the upper substrate US may be 100% or higher. A thickness of the upper substrate US may be 10 μm to 1 mm, but is not limited thereto.

The upper substrate US may be formed of the same or substantially the same material as the lower substrate 110. For example, the upper substrate US may be formed of a silicon rubber such as polydimethylsiloxane (PDMS) or an elastomer such as polyurethane (PU) or polytetrafluoroethylene (PTFE) and thus have a flexible property. However, the material of the upper substrate US is not limited thereto.

In the meantime, even though not illustrated in FIG. 4, a polarization layer may be disposed on the upper substrate US. The polarization layer may perform a function which polarizes light incident from the outside of the stretchable display device 100 to reduce the external light reflection. Further, an optical film other than the polarization layer may be disposed on the upper substrate US.

Referring to FIG. 4, the lower substrate 110 of the stretchable display device 100 may be divided into a plurality of first areas A1 in which the plurality of pixel substrates 111a is disposed and a plurality of second areas A2 in which the first connection line 180a is disposed.

Referring to FIG. 4, the plurality of first areas A1 is an area in which the plurality of pixel substrates 111a is disposed and is a rigid area. The plurality of first areas A1 is spaced apart from each other to be defined on the lower substrate 110.

Referring to FIG. 4, the plurality of second areas A2 is defined to be adjacent to the plurality of first areas A1. Specifically, the plurality of second areas A2 is defined between two first areas A1 which are adjacent to each other. The plurality of second areas A2 is wiring areas in which the first connection line 180a is disposed and has a malleability. When the stretchable display device 100 is stretched, the plurality of second areas A2 is extended. The plurality of second areas A2 is spaced apart from each other to be defined on the lower substrate 110.

Planar and Cross-Sectional Structures of Grip Area

Figure 5:
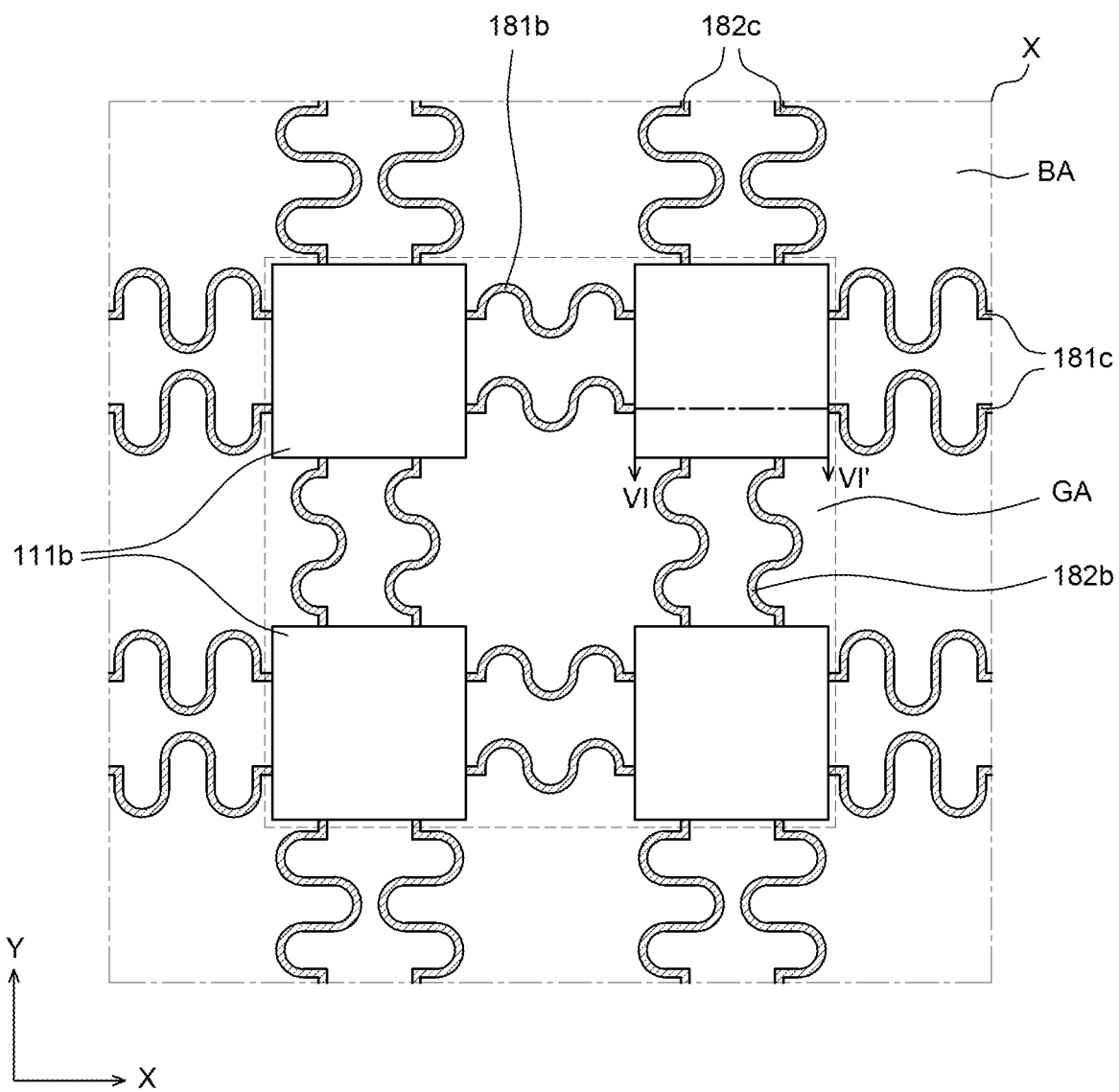
FIG. 5 is a schematic enlarged plan view of an X area of FIG. 2.
Figure 6A:
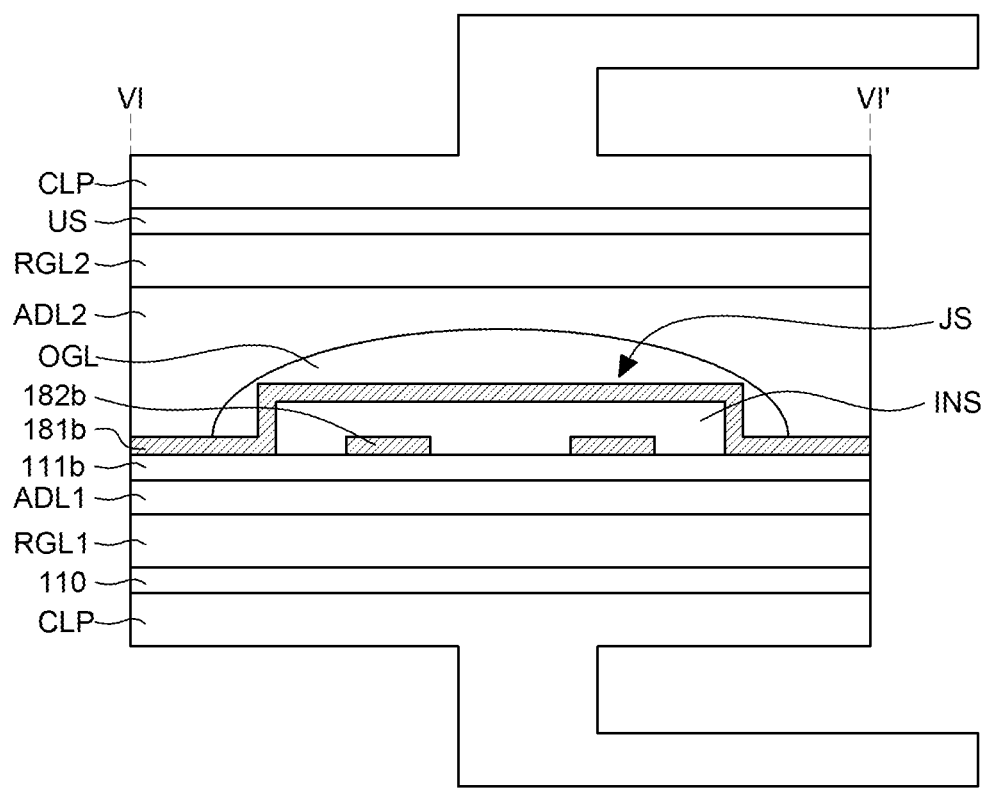
FIGS. 6A to 6C are cross-sectional views taken along the line VI-VI' of FIG. 5.
Figure 6B:
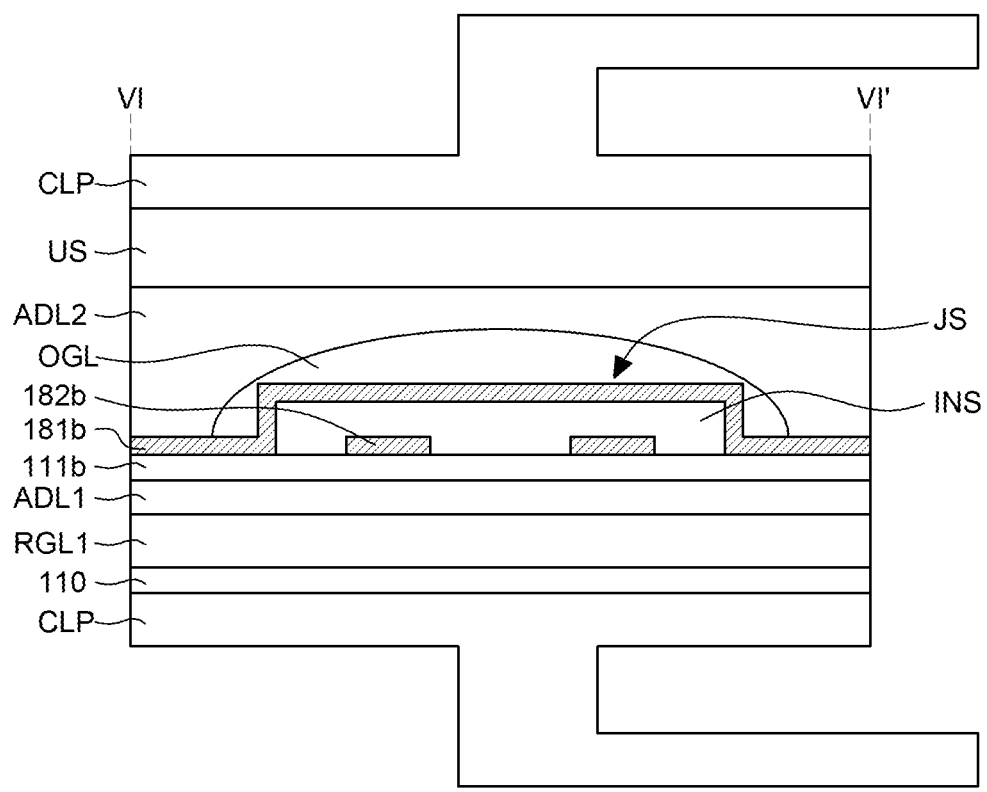
Figure 6C:
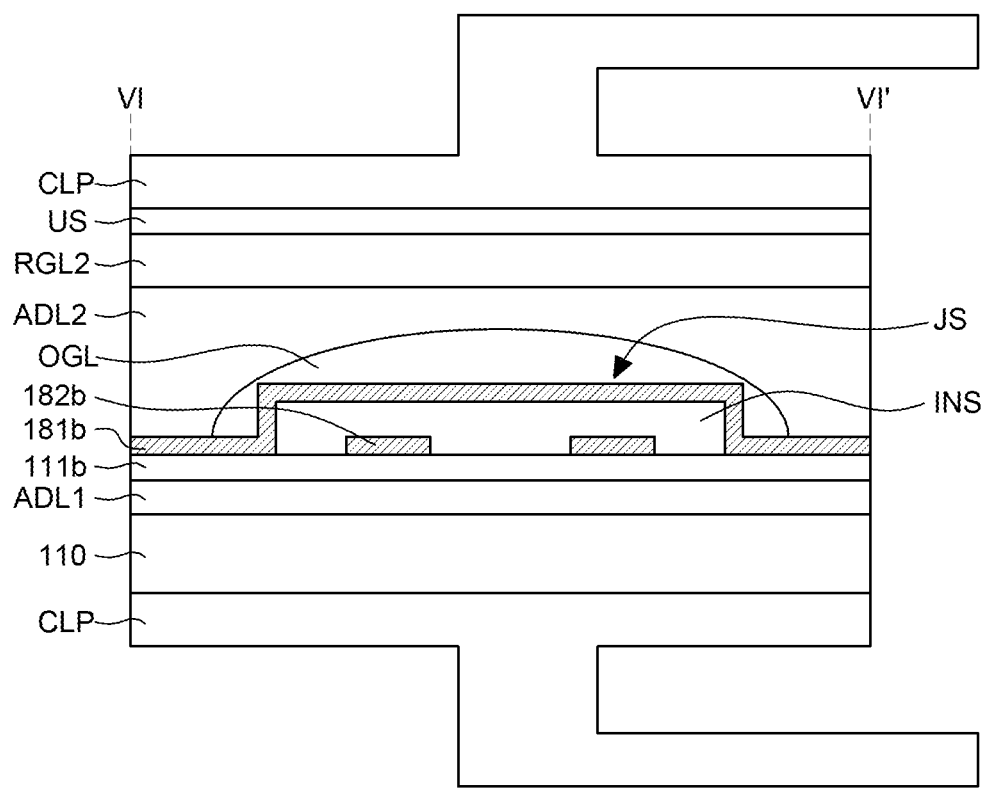

FIG. 5 is a schematic enlarged plan view of an X area of FIG. 2. FIGS. 6A to 6C are cross-sectional views taken along the line VI-VI' of FIG. 5.

As illustrated in FIG. 5, the grip area GA is enclosed by the adjacent buffer area BA.

Further, in the grip area GA, the plurality of base substrates 111b and the second connection lines 180b are disposed on the lower substrate 110 in the grip area GA.

The plurality of base substrates 111b is spaced apart from each other to be disposed on the lower substrate 110. For example, as illustrated in FIG. 5, the plurality of base substrates 111b may be disposed on the lower substrate 110 in a 2×2 matrix, but is not limited thereto.

Further, in the grip area GA, the clamp CLP may be in direct contact with the grip area GA to stretch the stretchable display device 100. Therefore, pixels may not be formed on the plurality of base substrates 111b in the grip area GA. For example, when the clamp CLP is disposed in the grip area GA, the pixels may not be formed on the pixel substrate 111b. However, when a body of the user is temporarily in contact with the grip area GA, the pixel may be formed on the pixel substrate 111b. However, the clamp CLP is in contact with the grip area GA so that in order to counteract an external force due to the clamp CLP, at least one rigid layer may be disposed on or below the base substrate 111b.

Further, the plurality of second connection lines 180b may be electrically connected to the first connection lines 180a disposed in the display area AA. To be more specific, the plurality of second connection lines 180b may be electrically connected to the first connection line 180a by means of a third connection line 180c disposed in the buffer area BA.

In the grip area GA, the second connection line 180b may be disposed not only between the plurality of base substrates 111b, but also on the base substrate 111b. Specifically, the second connection line 180b disposed between the base substrates 111b may have a wavy shape for the uniformity of the process, similarly to the first connection line 180a. For example, the second connection line 180b disposed between the base substrates 111b may have various shapes such as a sine wave shape, a zigzag pattern, or a shape extended by connecting a plurality of rhombus-shaped substrates at vertexes. Further, the second connection line 180b disposed on the base substrate 111b may have a straight line shape.

However, the second connection line 180b is disposed in the grip area GA which is in contact with the clamp CLP and does not extend, so that the stretchability of the second connection line 180b is not necessary. Therefore, the shape of the second connection line 180b is not limited to the above-described shape and varies in various forms.

The second connection line 180b includes a third sub connection line 181b and a fourth sub connection line 182b. Specifically, the third sub connection line 181b refers to a wiring line of the second connection line 180b extending in the X-axis direction and the fourth sub connection line 182b refers to a wiring line of the second connection lines 180b extending in the Y-axis direction.

The third sub connection line 181b and the fourth sub connection line 182b serve as different signal lines so that the third sub connection line 181b and the fourth sub connection line 182b should not be electrically connected to each other. Therefore, the third sub connection line 181b and the fourth sub connection line 182b may be disposed on the base substrate 111b with a jumping structure JS. The jumping structure JS of the third sub connection line 181b and the fourth sub connection line 182b will be described below in detail with reference to FIGS. 6A to 6C.

Further, the second connection line 180b may be formed of a metal material such as copper (Cu), aluminum (Al), titanium (Ti), and molybdenum or a stacked structure of metal materials such as copper/molybdenum-titanium (Cu/Moti) or titanium/aluminum/titanium (Ti/Al/Ti), but is not limited thereto.

In the meantime, referring to FIG. 6A, in order to stretch the stretchable display device 100, the clamp CLP is in direct contact to be fixed below the lower substrate 110 and on the upper substrate US in the clamp CLP area GA.

Further, a first rigid layer RGL1 is disposed on the lower substrate 110. The first rigid layer RGL1 protects an internal wiring line from an external force caused by the clamp CLP which is in direct contact below the lower substrate 110. To this end, the first rigid layer RGL1 may have a rigid characteristic.

In the meantime, a modulus of the first rigid layer RGL1 may be higher than a modulus of the lower substrate 110. For example, the modulus of the first rigid layer RGL1 may be two times higher than the modulus of the lower substrate 110, but is not limited thereto.

With regard to this, the first rigid layer RGL1 may be formed of the same or substantially the same material as the lower substrate 110. For example, the first rigid layer RGL1 may be formed of a silicon rubber such as polydimethylsiloxane (PDMS) or an elastomer such as polyurethane (PU) or polytetrafluoroethylene (PTFE), but is not limited thereto. The first rigid layer RGL1 may be formed of a different material from the lower substrate 110.

Further, the first rigid layer RGL1 is formed of the same or substantially the same material as the lower substrate 110 and a degree of polymerization of the first rigid layer RGL1 may be higher than a degree of polymerization of the lower substrate 110. The degree of polymerization means repeated units constituting the polymer material, and the higher the degree of polymerization, the higher the strength of the polymer material.

Therefore, the modulus of the first rigid layer RGL1 may be increased by adjusting the degree of polymerization of the material which constitutes the first rigid layer RGL1. For example, when both the first rigid layer RGL1 and the lower substrate 110 are formed of polydimethylsiloxane (PDMS), the degree of polymerization of polydimethylsiloxane which constitutes the first rigid layer RGL1 may be adjusted to be larger than the degree of polymerization of polydimethylsiloxane which constitutes the lower substrate 110. Therefore, the modulus of the first rigid layer RGL1 may be adjusted to be larger than the modulus of the lower substrate 110. In this case, the degree of polymerization of the material which constitutes the first rigid layer RGL1 may be two times higher than the degree of polymerization of the material which constitutes the lower substrate 110, but is not limited thereto.

Further, the first adhesive layer ADL1 may be disposed on the first rigid layer RGL1. The first adhesive layer ADL1 allows the first rigid layer RGL1 to be in contact with the base substrate 111b.

The first adhesive layer ADL1 is formed of resin, and to be more specific, may be formed of resin including any one of epoxy, phenol, amino, unsaturated polyester, rubber, polyimide, silicon, acryl, and vinyl. Further, the first adhesive layer ADL1 may be formed of a curable resin or a pressure sensitive adhesive (PSA).

The second connection line 180b is disposed on the base substrate 111b. Specifically, the third sub connection line 181b, the fourth sub connection line 182b, and an insulating layer INS disposed between the third sub connection line 181b and the fourth sub connection line 182b may be disposed on the base substrate 111b.

As described in detail with reference to FIG. 5, the third sub connection line 181b extends in the X-direction and the fourth sub connection line 182b extends in the Y-direction, on the base substrate 111b. The third sub connection line 181b and the fourth sub connection line 182b serve as different signal lines so that the third sub connection line 181b and the fourth sub connection line 182b should not be electrically connected to each other. Therefore, as illustrated in FIGS. 6A to 6C, the third sub connection line 181b may be formed to have a jumping structure JS in an overlapping area of the third sub connection line 181b and the fourth sub connection line 182b. That is, the third sub connection line 181b moves to an upper layer to extend in the X-direction in the overlapping area of the third sub connection line 181b and the fourth sub connection line 182b. Further, the fourth sub connection line 182b extends in the Y-direction on the base substrate 111b without moving between layers.

Further, the insulating layer INS may be disposed between the third sub connection line 181b and the fourth sub connection line 182b disposed on the upper layer in the overlapping area of the third sub connection line 181b and the fourth sub connection line 182b. The above-described insulating layer INS may be formed as a single layer of silicon nitride (SiNx) or silicon oxide (SiOx) which is an inorganic material or a multi-layer of silicon nitride (SiNx) or silicon oxide (SiOx), but it is not limited thereto. That is, the third sub connection line 181b and the fourth sub connection line 182b are not electrically connected due to the insulating layer INS so that the third sub connection line 181b and the fourth sub connection line 182b may transmit different signals, respectively.

Further, an organic protection layer OGL may be disposed above the overlapping area of the third sub connection line 181b and the fourth sub connection line 182b. That is, the organic protection layer OGL may be disposed so as to overlap the overlapping area of the third sub connection line 181b and the fourth sub connection line 182b. The organic protection layer OGL may be configured by a single layer or a plurality of layers and may be formed of an organic material. For example, the organic protection layer OGL may be formed of an acrylic-based organic material, but is not limited thereto.

The above-described organic protection layer OGL may be formed of an organic material which is less rigid than the first rigid layer RGL1 or a second rigid layer RGL2. Therefore, the organic protection layer OGL performs a cushion function. Accordingly, the internal wiring line may be protected from the external force of the clamp CLP which is in contact above the upper substrate US or below the lower substrate 110.

To be more specific, when the organic protection layer OGL is not disposed, the third sub connection line 181b and the fourth sub connection line 182b may be disconnected in the overlapping area of the third sub connection line 181b and the fourth sub connection line 182b due to the external force of the clamp CLP. However, the stretchable display device according to the embodiment of the present disclosure includes an organic protection layer OGL so that the external force of the clamp CLP may be absorbed onto the organic protection layer OGL. Therefore, the disconnection of the third sub connection line 181b and the fourth sub connection line 182b in the overlapping area of the third sub connection line 181b and the fourth sub connection line 182b due to the external force of the clamp CLP does not occur. Therefore, the third sub connection line 181b and the fourth sub connection line 182b may transmit different signals.

Further, a second adhesive layer ADL2 may be disposed on the organic protection layer OGL. The second adhesive layer ADL2 bonds the second rigid layer RGL2 and the connection substrate to each other.

The second adhesive layer ADL2 is also formed of resin, and to be more specific, may be formed of resin including any one of epoxy, phenol, amino, unsaturated polyester, rubber, polyimide, silicon, acryl, and vinyl. Further, the second adhesive layer ADL2 may be formed of a curable resin or a pressure sensitive adhesive (PSA).

Further, the second rigid layer RGL2 is disposed between the second adhesive layer ADL2 and the upper substrate US. The second rigid layer RGL2 protects an internal wiring line from an external force caused by the clamp CLP which is in direct contact above the upper substrate US. To this end, the second rigid layer RGL2 may have a rigid characteristic.

In the meantime, a modulus of the second rigid layer RGL2 may be higher than a modulus of the lower substrate 110. For example, the modulus of the second rigid substrate RGL2 may be two times higher than the modulus of the lower substrate 110, but is not limited thereto.

With regard to this, the second rigid layer RGL2 may be formed of the same or substantially the same material as the lower substrate 110. For example, the second rigid layer RGL2 may be formed of a silicon rubber such as polydimethylsiloxane (PDMS) or an elastomer such as polyurethane (PU) or polytetrafluoroethylene (PTFE), but is not limited thereto. The second rigid layer RGL2 may be formed of a different material from the lower substrate 110.

Further, the second rigid layer RGL2 is formed of the same or substantially the same material as the lower substrate 110 and a degree of polymerization of the second rigid layer RGL2 may be higher than a degree of polymerization of the lower substrate 110. The degree of polymerization means repeated units constituting the polymer material, and the higher the degree of polymerization, the higher the strength of the polymer material.

Therefore, the modulus of the second rigid layer RGL2 may be increased by adjusting the degree of polymerization of the material which constitutes the second rigid layer RGL2. For example, when both the second rigid layer RGL2 and the lower substrate 110 are formed of polydimethylsiloxane (PDMS), the degree of polymerization of polydimethylsiloxane which constitutes the second rigid layer RGL2 may be adjusted to be larger than the degree of polymerization of polydimethylsiloxane which constitutes the lower substrate 110. Therefore, the modulus of the second rigid layer RGL2 may be adjusted to be larger than the modulus of the lower substrate 110. In this case, the degree of polymerization of the material which constitutes the second rigid layer RGL2 may be two times higher than the degree of polymerization of the material which constitutes the lower substrate 110, but is not limited thereto.

However, in FIG. 6A, it is illustrated that both the first rigid layer RGL1 adjacent to the lower substrate 110 and the second rigid layer RGL2 adjacent to the upper substrate US are disposed.

However, depending on the necessity for the design, as illustrated in FIG. 6B, only the first rigid layer RGL1 adjacent to the lower substrate 110 may be disposed below the base substrate 111b and as illustrated in FIG. 6C, only the second rigid layer RGL2 adjacent to the upper substrate US may be disposed below the base substrate 111b.

However, in FIGS. 6A to 6C, a cross-section of the grip area GA disposed in the display area AA is illustrated and described. However, as described above, the grip area GA may also be disposed in the outer peripheral area OA so that the cross-section of the grip area GA illustrated in the cross-sectional views of FIGS. 6A to 6C may be applied to the gate driver GD disposed in the outer peripheral area OA.

Third Connection Line Disposed in Buffer Area

As illustrated in FIG. 5, the buffer area BA is an area which encloses the grip area GA.

Further, the plurality of third connection lines 180c is disposed on the lower substrate 110 in the buffer area BA.

The plurality of third connection lines 180c may be electrically connected to the first connection line 180a disposed in the display area AA and the second connection line 180c disposed in the grip area GA.

To be more specific, the third connection line 180c includes a fifth sub connection line 181c and a sixth sub connection line 182c. Specifically, the fifth sub connection line 181c refers to a wiring line of the third connection line 180c extending in the X-axis direction and the sixth sub connection line 182c refers to a wiring line of the third connection line 180c extending in the Y-axis direction.

In summary, the first sub connection line 181a, the third sub connection line 181b, and the fifth sub connection line 181c which extend in the X-axis direction may be electrically connected to each other. In summary, the first sub connection line 181a, the third sub connection line 181b, and the fifth sub connection line 181c which are electrically connected may serve as gate lines.

In contrast, the second sub connection line 182a, the fourth sub connection line 182b, and the sixth sub connection line 182c which extend in the Y-axis direction may be electrically connected to each other. For example, the second sub connection line, the fourth sub connection line, and the sixth sub connection line which are electrically connected may serve as data lines.

As described above, in the buffer area BA, a component which reduces a stretching stress generated when the stretching display device 100 is stretched using the plurality of clamps CLP needs to be disposed.

Therefore, in the buffer area BA, the third connection line 180c having a high extension rupture rate may be disposed. Therefore, the third connection line 180c may also have a wavy shape. For example, the third connection line 180c has various shapes such as a sine wave shape, a zigzag pattern, or a shape extended by connecting a plurality of rhombus-shaped substrates at vertexes.

However, in order to reduce the stretching stress, the third connection line 180c may have a ductile breaking rate higher than that of the first connection line 180a. Therefore, the third connection line 180c may be formed to be wavier than the first connection line 180a. Alternatively, the third connection line 180c may be formed to be thinner than the first connection line 180a. A detailed description thereof will be made below with reference to FIGS. 8A to 8C.

Further, the third connection line 180c may be formed of a metal material such as copper (Cu), aluminum (Al), titanium (Ti), and molybdenum or a stacked structure of metal materials such as copper/molybdenum-titanium (Cu/Moti) or titanium/aluminum/titanium (Ti/Al/Ti), but is not limited thereto.

Figure 7:
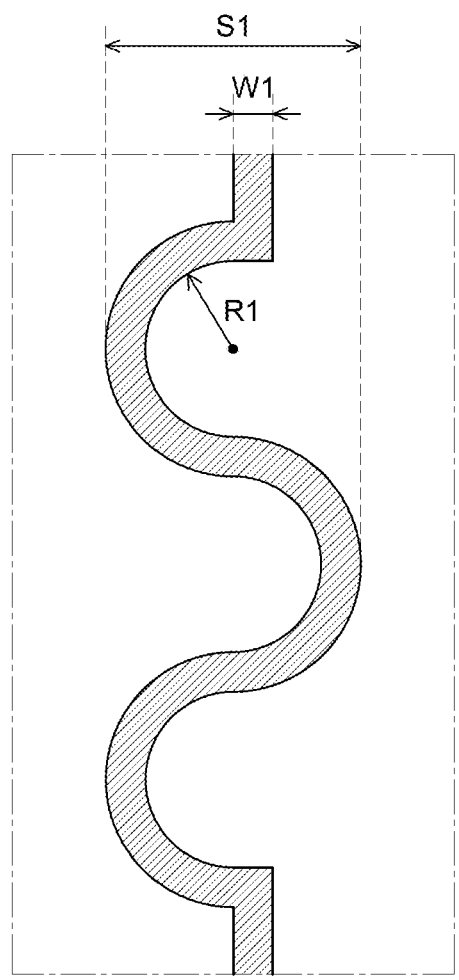
FIG. 7 is an enlarged plan view of a first connection line of a stretchable display device according to an embodiment of the present disclosure.
Figure 8A:
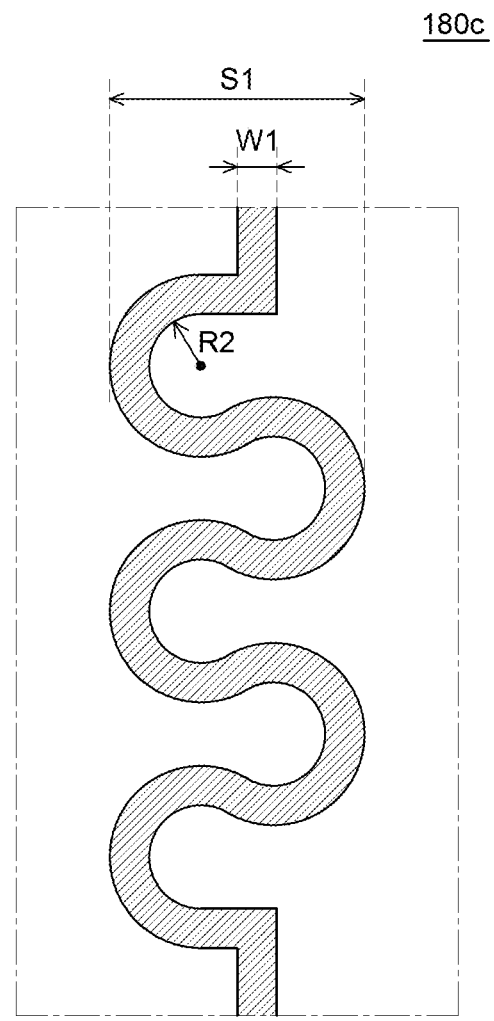
FIGS. 8A to 8C are enlarged plan views of a third connection line of a stretchable display device according to an embodiment of the present disclosure.
Figure 8B:
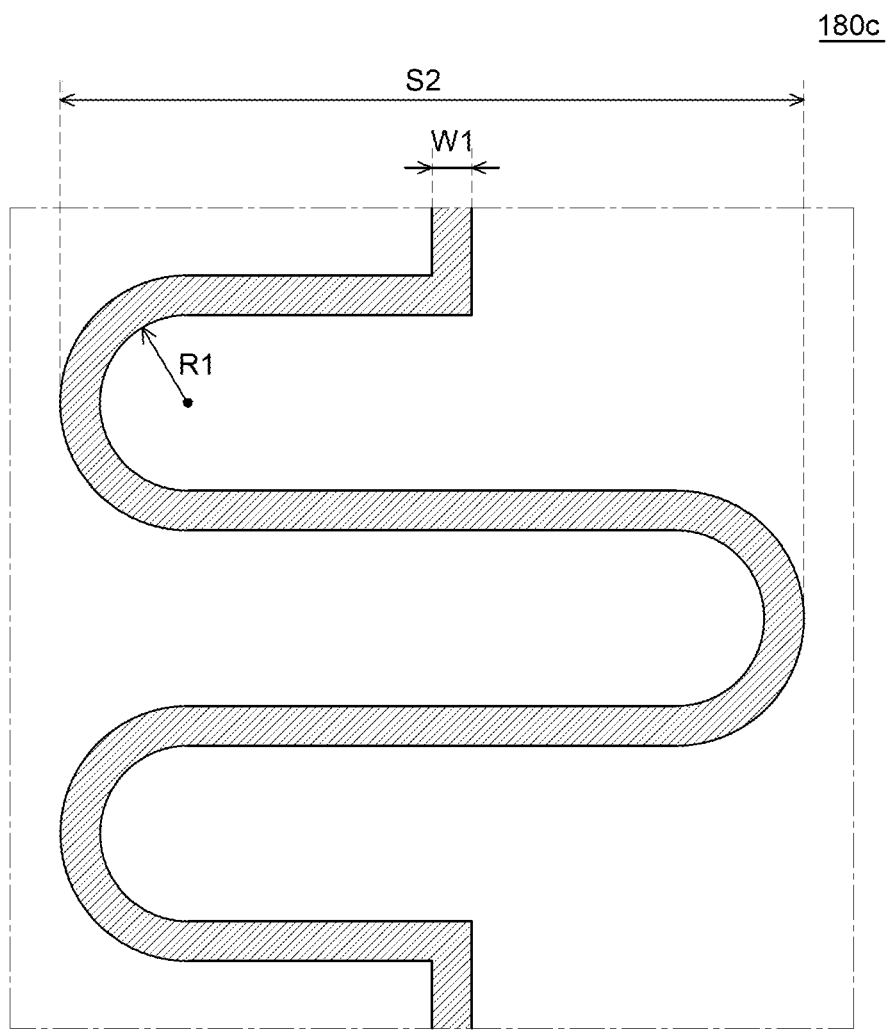
Figure 8C:
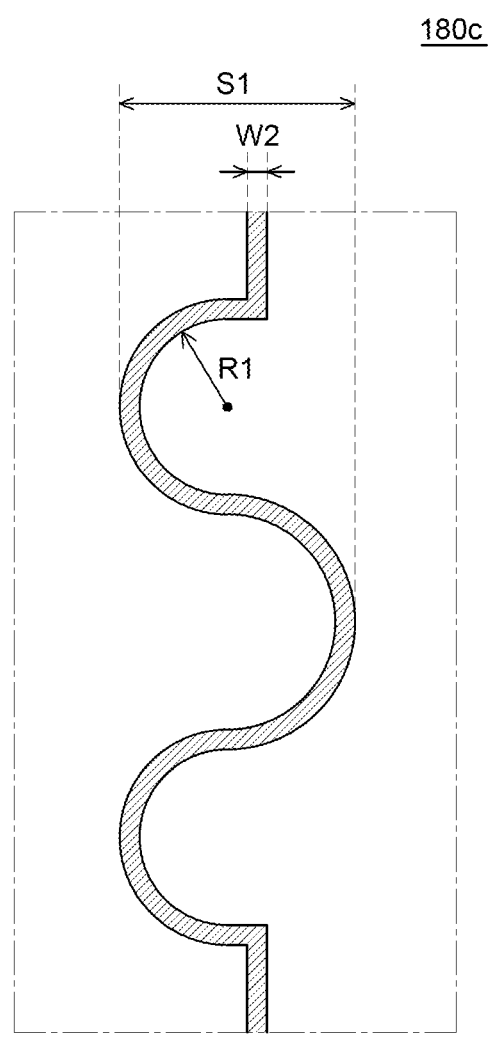

FIG. 7 is an enlarged plan view of a first connection line of a stretchable display device according to an embodiment of the present disclosure. FIGS. 8A to 8C are enlarged plan views of a third connection line of a stretchable display device according to an embodiment of the present disclosure;

The first connection line 180a disposed in the display area AA may have a wavy shape to be extended.

Specifically, in FIG. 7, the first connection line 180a is illustrated to have a sine wave form having a first radius of curvature R1, a first amplitude S1, and a first width W1.

The above-described first radius of curvature R1 refers to a radius of a circular part curved in the first connection line 180a. Further, the first amplitude S1 refers to a maximum amplitude at which the first connection line 180a swings, with respect to a direction perpendicular to a stretching direction of the first connection line 180a. Further, the first width W1 refers to a width of a cross-section of the first connection line 180a with respect to a plan view.

As described above, in order to reduce the stretching stress in the buffer area BA, the third connection line 180c may have a ductile breaking rate higher than that of the first connection line 180a.

Therefore, the third connection line 180c may be formed to be wavier than the first connection line 180a. Alternatively, the third connection line 180c may be formed to be thinner than the first connection line 180a.

Specifically, referring to FIG. 8A, the third connection line 180c may have a wavy shape with a second radius of curvature R2, the first amplitude S1, and the first width W1.

Further, the second radius of curvature R2 may be smaller than the first radius of curvature R1. That is, the radius of curvature R2 of the third connection line 180c may be smaller than the radius of curvature R2 of the first connection line 180a.

Therefore, the third connection line 180c may be formed to be wavier than the first connection line 180a so that the ductile breaking rate of the third connection line 180c may be higher than that of the first connection line 180a.

Next, referring to FIG. 8B, the third connection line 180c may have a wavy shape with a first radius of curvature R1, the second amplitude S2, and the first width W1. Further, the second amplitude S2 may be larger than the first amplitude S1. That is, the amplitude S2 of the third connection line 180c may be larger than the amplitude S1 of the first connection line 180a.

Therefore, the third connection line 180c may be formed to be wavier than the first connection line 180a so that the ductile breaking rate of the third connection line 180c may be higher than that of the first connection line 180a.

Finally, referring to FIG. 8C, the third connection line 180c may have a sine wave shape with a first radius of curvature R1, the first amplitude S1, and the second width W2. Further, the second width W2 may be smaller than the first width W1. That is, the width W2 of the third connection line 180c may be smaller than the width W1 of the first connection line 180a.

Therefore, the third connection line 180c may be formed to be wavier than the first connection line 180a so that the ductile breaking rate of the third connection line 180c may be higher than that of the first connection line 180a.

As described above, the ductile breaking rate of the third connection line 180c may be improved by setting the radius of curvature R2 of the third connection line 180c to be small, setting the amplitude S2 to be large, or setting the width W2 to be small.

Therefore, the stretching stress concentrated on the buffer area BA when the stretchable display device 100 is stretched may be alleviated. By doing this, the crack or breakage caused when the stretchable display device 100 is stretched using the clamp CLP may be suppressed.

Various Embodiments of Grip Area and Buffer Area

Figure 9:
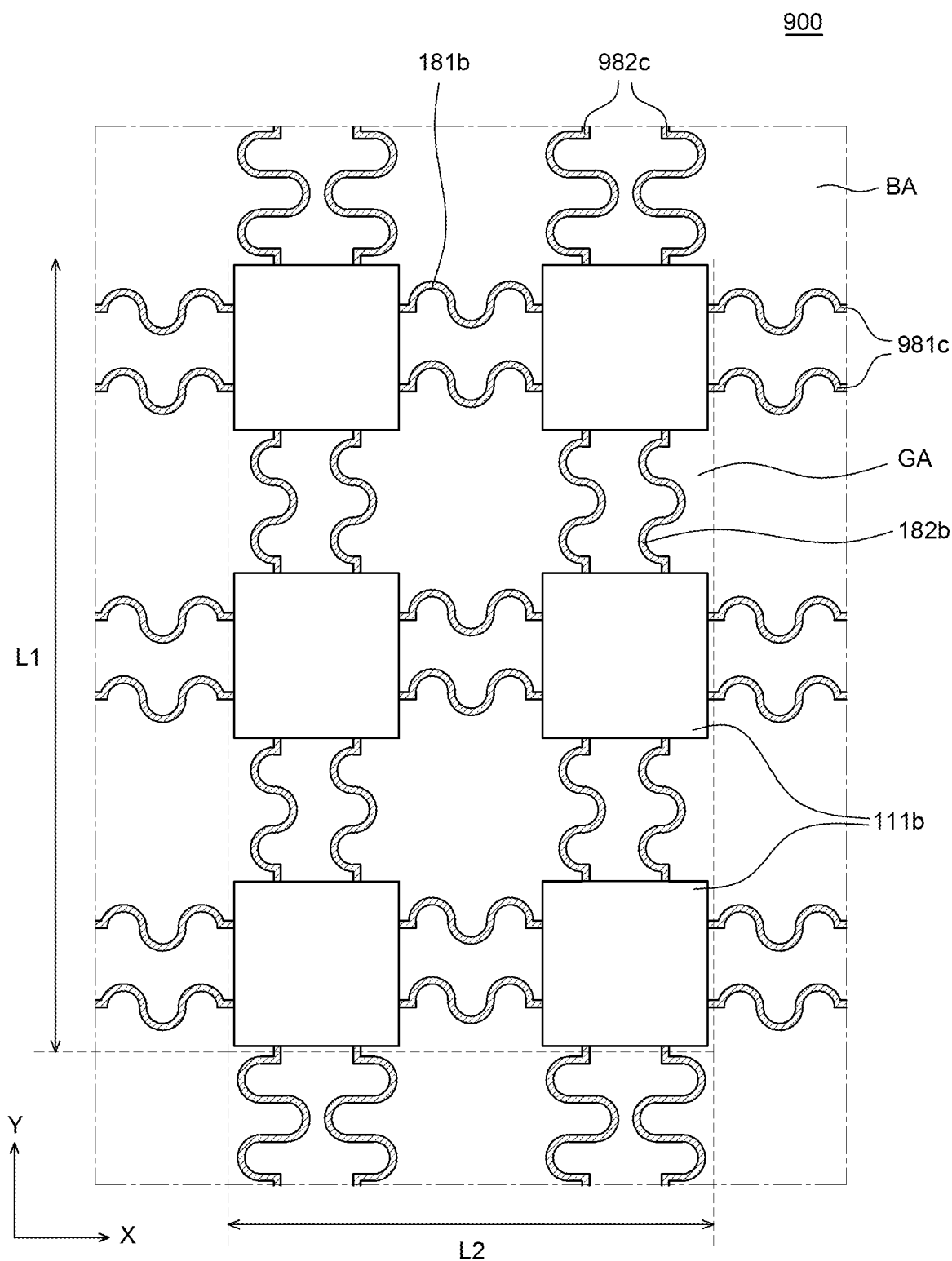
FIG. 9 is an enlarged plan view of a grip area and a buffer area of a stretchable display device according to another embodiment of the present disclosure.

FIG. 9 is an enlarged plan view of a grip area and a buffer area of a stretchable display device according to another embodiment of the present disclosure. A stretchable display device 900 illustrated in FIG. 9 has configurations which are substantially the same as the stretchable display device 100 according to the embodiment of the present disclosure illustrated in FIG. 5 except for a grip area GA and a buffer area BA. Therefore, a redundant description will be omitted.

The stretchable display device 900 according to another embodiment of the present disclosure may extend in the Y-direction which is a second direction.

By doing this, in the stretchable display device 900 according to another embodiment of the present disclosure, a force applied in the Y-direction which is the second direction may be different from a force applied in the X-direction which is the first direction. Specifically, when the stretchable display device 900 extends in the Y-direction which is the second direction, a tensile force acts on the Y-direction which is the second direction and a contractile force acts on the X-direction which is the first direction.

Therefore, in the stretchable display device 900 according to another embodiment of the present disclosure, in accordance with the stretching direction, shapes of the grip area GA and the buffer area BA vary and a shape of the third connection line 980c also varies.

Specifically, based on the premise that the stretchable display device 900 extends in the Y-direction which is the second direction, a first length L1 of the grip area GA in the Y-direction may be longer than a first length L2 of the X-direction.

For example, as illustrated in FIG. 9, the plurality of base substrates 111b may be disposed on the lower substrate 110 in a 2×3 matrix.

Further, the shape of the buffer area BA may also be deformed in accordance with the above-described grip area GA. That is, a first length L1 of the buffer area BA in the Y-direction may be larger than a first length L2 of the X-direction.

In other words, the length of the grip area GA and the buffer area BA in the stretching direction may be larger than the length in a direction perpendicular to the stretching direction.

Therefore, in the stretchable display device 900 according to another embodiment of the present disclosure, the grip area GA and the buffer area BA are formed to be long in the stretching direction to cope with the tensile force applied to the stretching direction.

By doing this, the stretchable display device 900 according to another embodiment of the present disclosure may effectively disperse the stretching stress to enhance the reliability of the stretching of the stretchable display device 900.

In the meantime, in the stretchable display device 900 according to another embodiment of the present disclosure, the ductile breaking rate of the fifth sub connection line 981c and the sixth sub connection line 982c which are third connection lines 980c may be set to be different depending on the stretching direction.

Based on the premise that the stretchable display device 900 extends in the Y-direction which is the second direction, the ductile breaking rate of the sixth sub connection line 982c which extends in the Y-direction which is the stretching direction is higher than the ductile breaking rate of the fifth sub connection line 981c which extends in the X-direction perpendicular to the stretching direction.

As illustrated in FIG. 9, a radius of curvature of the sixth sub connection line 982c may be smaller than a radius of curvature of the fifth sub connection line 981c. Further, an amplitude of the sixth sub connection line 982c may be larger than an amplitude of the fifth sub connection line 981c. Specifically, even though not illustrated in the drawing, a width of the sixth sub connection line 982c may be narrower than a width of the fifth sub connection line 981c.

As described above, the ductile breaking rate of the sixth sub connection line 982c which extends in the stretching direction is set to be high to cope with the tensile force which acts on the stretching direction.

In contrast, the fifth sub connection line 981c which extends in a direction perpendicular to the stretching direction is set to be low to cope with the contractile force which acts on the direction perpendicular to the stretching direction.

As a result, the ductile breaking rates of the fifth sub connection line 981c and the sixth sub connection line 982c may be set to be different depending on the stretching direction so that the stretching stress of the stretchable display device may be effectively dispersed. By doing this, the stretching reliability of the stretchable display device 900 is enhanced to more effectively suppress the cracks or breakage generated when the stretchable display device 900 is stretched in one direction using the clamp CLP.

Figure 10:
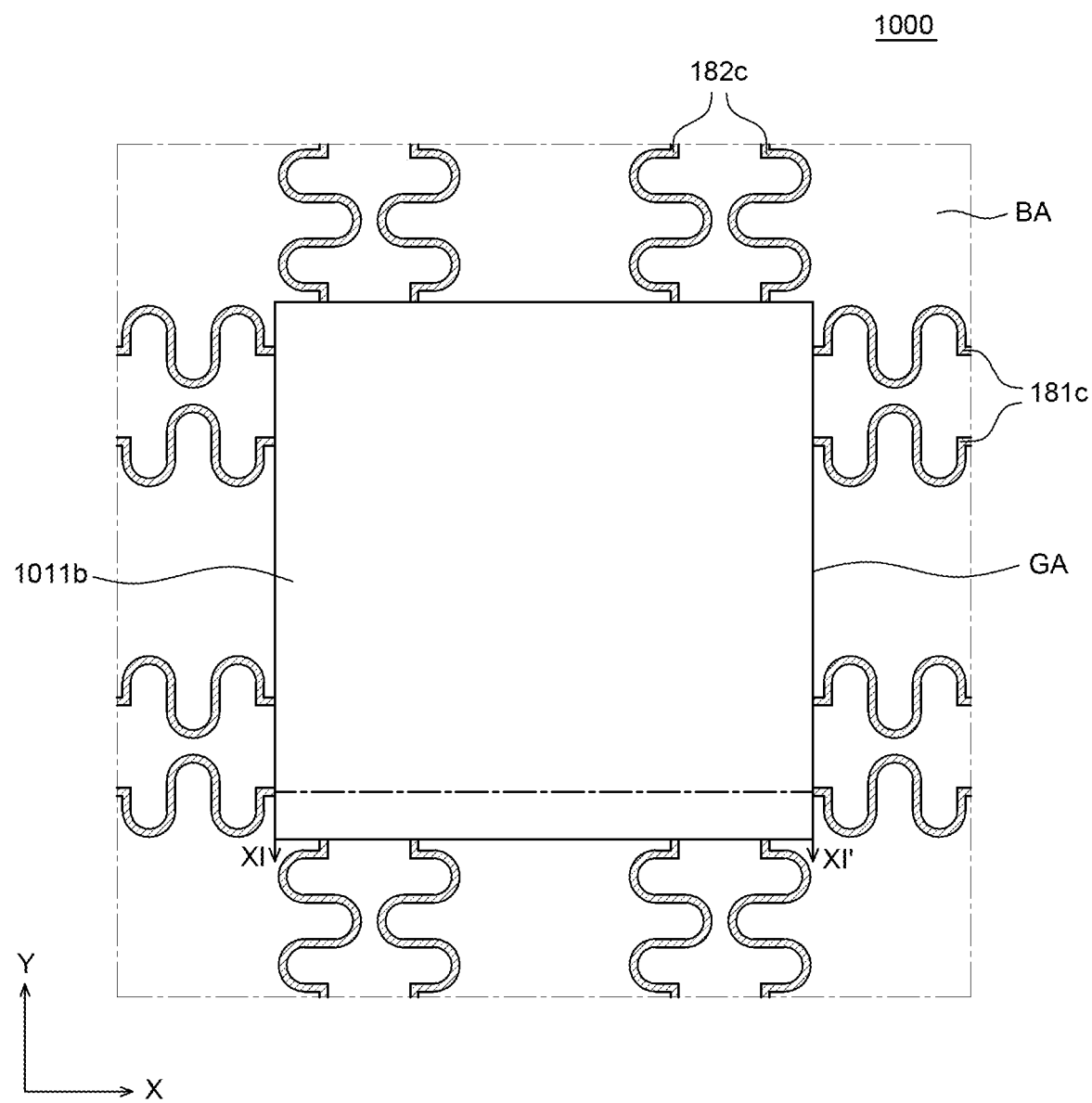
FIG. 10 is an enlarged plan view of a grip area and a buffer area of a stretchable display device according to still another embodiment of the present disclosure.
Figure 11:
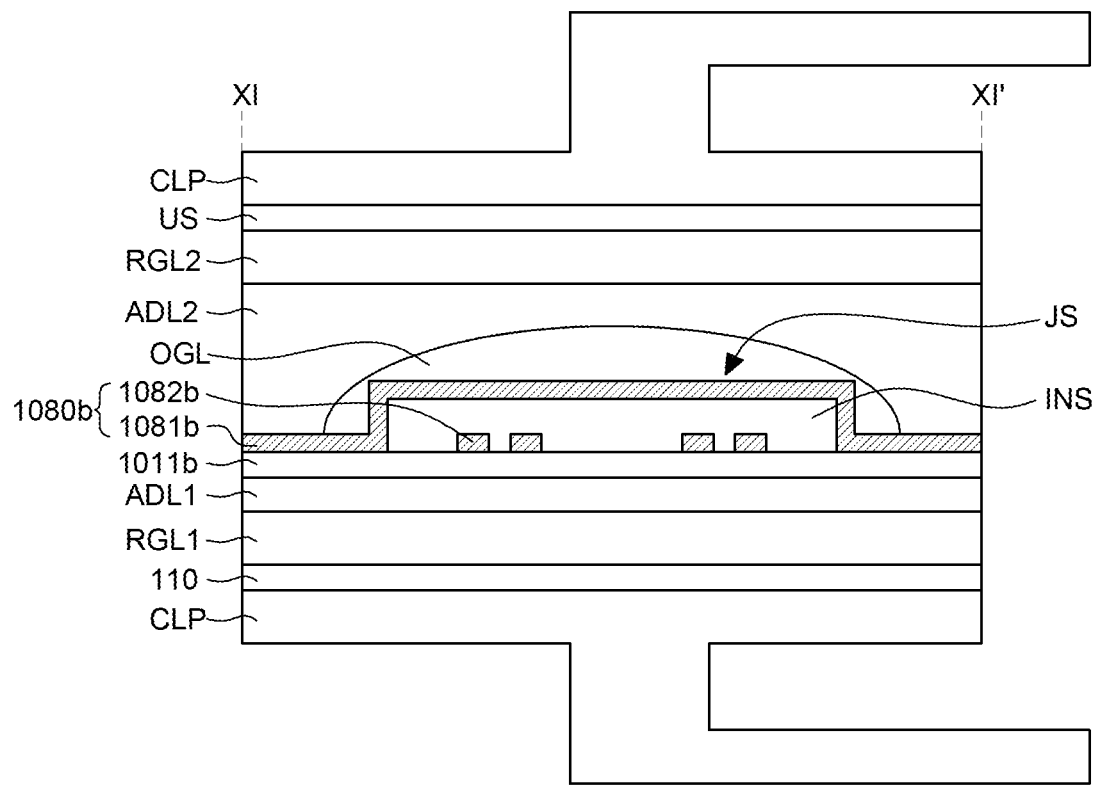
FIG. 11 is a cross-sectional view taken along the line XI-XI' of FIG. 10.

FIG. 10 is an enlarged plan view of a grip area and a buffer area of a stretchable display device according to still another embodiment of the present disclosure. FIG. 11 is a cross-sectional view taken along the line XI-XI' of FIG. 10.

A stretchable display device 1000 illustrated in FIG. 10 has configurations which are substantially the same as the stretchable display device 100 according to the embodiment of the present disclosure illustrated in FIG. 5 except for a base substrate 1011b and a second connection line 1080b disposed in a grip area GA. Therefore, a redundant description will be omitted.

As illustrated in FIG. 10, according to still another embodiment of the present disclosure, only one base substrate 1011b may be disposed in the grip area GA.

That is, unlike the stretchable display device according to the embodiment of the present disclosure, according to another embodiment of the present disclosure, in one grip area GA, not the plurality of base substrates 1011b which are spaced apart from each other, but only one base substrate 1011b may be disposed.

Further, one base substrate 1011b described above may be disposed in the entire grip area GA. Accordingly, one base substrate 1011b may have the same or substantially the same shape as the grip area GA.

Further, as illustrated in FIG. 11, the third sub connection line 1081b and the fourth sub connection line 1082b which are second connection lines 1080b may be formed to have a jumping structure JS. That is, the third sub connection line 1081b moves to an upper layer to extend in the X-direction in the overlapping area of the third sub connection line 1081b and the fourth sub connection line 1082b. The fourth sub connection line 1082b extends in the Y-direction on the base substrate 1011b without moving between layers.

However, according to still another embodiment of the present disclosure, only one base substrate 1011b is disposed in the grip area GA so that as illustrated in FIG. 11, the third sub connection line 1081b may form only one jumping structure JS. According to the jumping structure JS, the third sub connection line 1081b moves to an upper layer in a first overlapping area and extends in the upper layer and then moves to a lower layer in the last overlapping area.

Further, the insulating layer INS may be disposed between the third sub connection line 1081b and the fourth sub connection line 1082b disposed on the upper layer in the overlapping area of the third sub connection line 1081b and the fourth sub connection line 1082b. Therefore, the third sub connection line 1081b and the fourth sub connection line 1082b are not electrically connected so that the third sub connection line 1081b and the fourth sub connection line 1082b may transmit different signals.

As described above, according to still another embodiment of the present disclosure, only one base substrate 1011b is disposed in the grip area GA. Further, the base substrate 1011b is a rigid substrate so that the rigidity of the grip area GA may be enhanced. Therefore, the connection between the grip area GA and the clamp CLP may be stable so that the stretching reliability of the stretchable display device 1000 may be improved.

Stretchable Display Device Including Organic Light Emitting Diode

Figure 12:
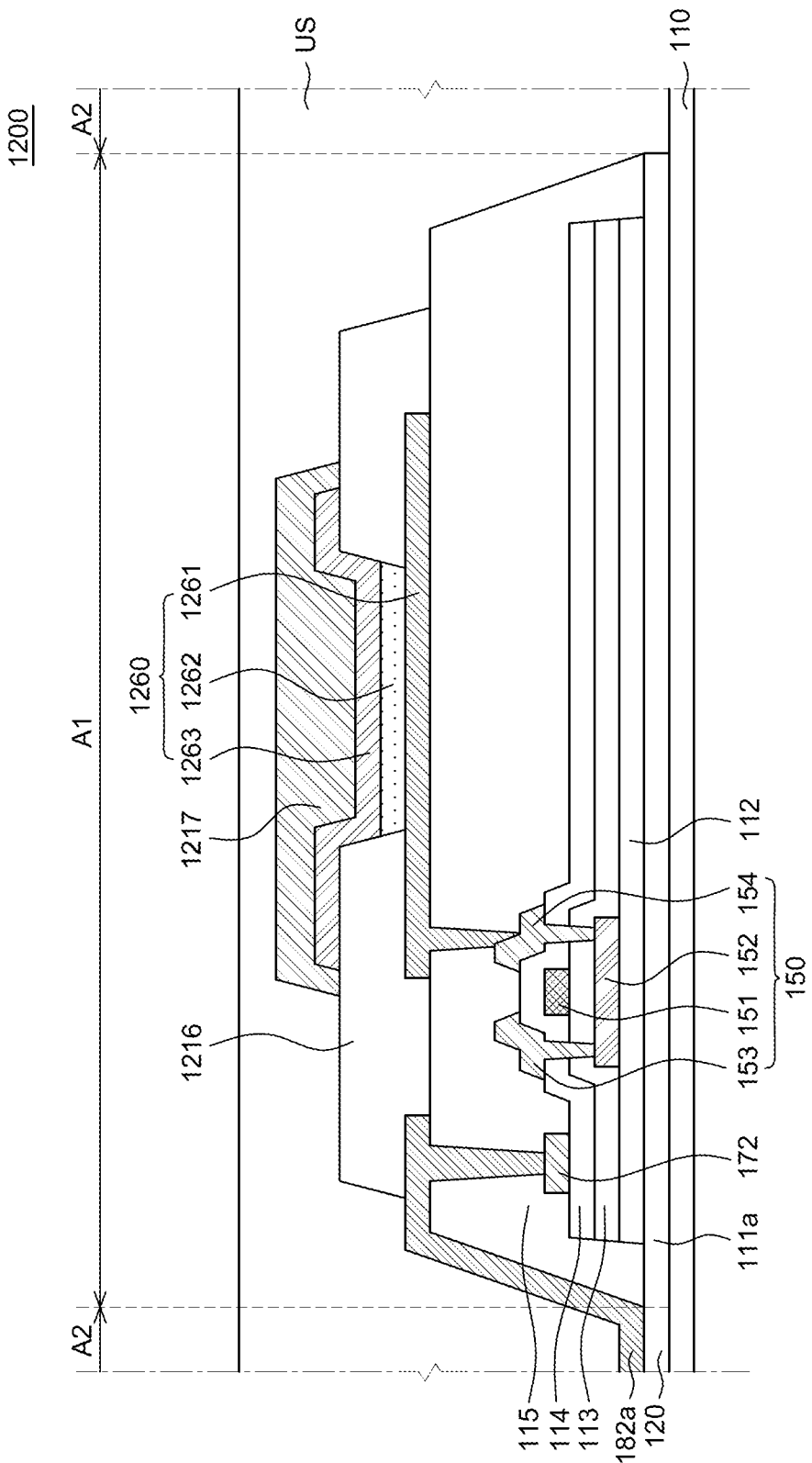
FIG. 12 is a schematic cross-sectional view of a stretchable display device according to still another embodiment of the present disclosure.

FIG. 12 is a schematic cross-sectional view of a stretchable display device according to still another embodiment of the present disclosure. A stretchable display device 1200 illustrated in FIG. 12 has configurations which are substantially the same as the stretchable display device 100 illustrated in FIG. 4 except for an organic light emitting diode 1260 and a bank 1216, so that a redundant description will be omitted.

Referring to FIG. 12, an organic light emitting diode 1260 is a component which disposed to correspond to each of the plurality of sub pixels SPX and emits light having a specific wavelength band. That is, the organic light emitting diode 1260 may be a blue organic light emitting diode which emits blue light, a red organic light emitting diode which emits red light, a green organic light emitting diode which emits green light, or a white organic light emitting diode which emits white light, but is not limited thereto. When the organic light emitting diode 1260 is a white organic light emitting diode, the stretchable display device 1200 may further include a color filter.

The organic light emitting diode 1260 includes an anode 1261, an organic light emitting layer 1262, and a cathode 1263. Specifically, the anode 1261 is disposed on the planarization layer 115. The anode 1261 is an electrode configured to supply holes to the organic light emitting layer 1262. The anode 1261 may be configured by a transparent conductive material having a high work function. Here, the transparent conductive material may include indium tin oxide (ITO), indium zinc oxide (IZO), or indium tin zinc oxide (ITZO). Further, when the stretchable display device 1200 is implemented as a top emission type, the anode 1261 may further include a reflector.

The anodes 1261 are disposed to be spaced apart from each other for each of the sub pixels SPX to be electrically connected to the transistor 150 through a contact hole of the planarization layer 115. For example, in FIG. 12, it is illustrated that the anode 1261 is electrically connected to the drain electrode 154 of the transistor 150, but the anode 1261 may be electrically connected to the source electrode 153.

The bank 1216 is disposed on the anode 1261 and the planarization layer 115. The bank 1216 is a component which divides adjacent sub pixels SPX. The bank 1216 is disposed to cover at least a part of both sides of the adjacent anode 1261 to expose a part of a top surface of the anode 1261. The bank 1216 may suppress a problem in that a current is concentrated at the corner of the anode 1261 to emit the light to the side surface of the anode 1261 so that an unintended sub pixel SPX emits light or colors are mixed. The bank 1216 may be formed of acrylic-based resin, benzocyclobutene (BCB)-based resin, or polyimide, but is not limited thereto.

The organic light emitting layer 1262 is disposed on the anode 1261. The organic light emitting layer 1262 is configured to emit light. The organic light emitting layer 1262 may include a luminescent material and the luminescent material may include a phosphorescent material or a fluorescent material, but is not limited thereto.

The organic light emitting layer 1262 may be configured by one emission layer. Alternatively, the organic light emitting layer 1262 may have a stack structure in which a plurality of emission layers laminated with a charge generation layer therebetween is laminated. Further, the organic light emitting layer 1262 may further include at least one organic layer of a hole transport layer, an electron transport layer, a hole blocking layer, an electron blocking layer, a hole injection layer, and an electron injection layer.

Referring to FIG. 12, the cathode 1263 is disposed on the organic light emitting layer 1262. The cathode 1263 supplies electrons to the organic light emitting layer 1262. The cathode 1263 may be formed of transparent conductive oxide such as indium tin oxide (ITO), indium zinc oxide (IZO), indium tin zinc oxide (ITZO), zinc oxide (ZnO), and tin oxide (TO) or ytterbium (Yb) alloy. Alternatively, the cathode 1263 may be formed of a metal material.

The cathode 1263 may be patterned to overlap the plurality of pixel substrates 111a. That is, the cathode 1263 is formed only in an area overlapping the plurality of pixel substrates 111a and may not be formed in an area between the plurality of pixel substrates 111a. Since the cathode 1263 is formed of a material such as a transparent conductive oxide or a metal material, when the cathode 1263 is formed in the area between the plurality of pixel substrates 111a, the cathode 1263 may be damaged during the process of stretching the stretchable display device 1200. Therefore, the cathode 1263 may be formed so as to correspond to each of the plurality of pixel substrates 111a on a flat surface. Referring to FIG. 12, the cathode 1263 may be formed to have an area which does not overlap the area where the first connection line 180a is disposed, in an area overlapping the plurality of pixel substrates 111a.

Unlike the general organic light emitting display device, in the stretchable display device 1200 according to still another embodiment of the present disclosure, the cathode 1263 is patterned so as to correspond to the plurality of pixel substrates 111a. Therefore, the cathode 1263 disposed on the plurality of pixel substrates 111a may be independently supplied with a low potential power through the first connection line 180a.

Referring to FIG. 12, an encapsulation layer 1217 is disposed on the organic light emitting diode 1260. The encapsulation layer 1217 covers the organic light emitting diode 1260 and is in contact with a part of the top surface of the bank 1216 to seal the organic light emitting diode 1260. Therefore, the encapsulation layer 1217 protects the organic light emitting diode 1260 from moisture, air, or physical impact permeating from the outside.

The encapsulation layer 1217 covers the cathode 1263 which is patterned to overlap the plurality of pixel substrates 111a and is formed in each of the plurality of pixel substrates 111a. That is, the encapsulation layer 1217 is disposed so as to cover one cathode 1263 disposed in one pixel substrate 111a and the encapsulation layer 1217 disposed on each of the plurality of pixel substrates 111a may be spaced apart from each other.

The encapsulation layer 1217 may be formed only in an area overlapping the plurality of pixel substrates 111a. As described above, the encapsulation layer 1217 may be configured to include an inorganic material so that the encapsulation layer may be easily cracked or damaged during a process of stretching the stretchable display device 1200. Specifically, since the organic light emitting diode 1260 is vulnerable to the moisture or oxygen, when the encapsulation layer 1217 is damaged, the reliability of the organic light emitting diode 1260 may be reduced.

However, as described above, the light emitting diode of the stretchable display device may be an LED and an organic light emitting diode, but is not limited thereto. Therefore, the light emitting diode of the stretchable display device may be a quantum dot light emitting diode (QLED) in which the light emitting layer is configured by a quantum dot material.

The embodiments of the present disclosure can also be described as follows:

According to an aspect of the present disclosure, a stretchable display device includes a lower substrate in which a display area including a plurality of pixels, a plurality of grip areas in which a clamp is disposed, and a buffer area adjacent to the plurality of grip areas are defined; a plurality of pixel substrates which is disposed in the display area to be spaced apart from each other; at least one base substrate which is disposed in each of the plurality of grip areas; a plurality of first connection lines which is disposed in the display area and connects the plurality of pixels formed on the plurality of pixel substrates; a plurality of second connection lines disposed in the grip area; and a plurality of third connection lines which is disposed in the buffer area, connects the plurality of first connection lines and the plurality of second connection lines, and has a ductile breaking rate higher than that of the plurality of first connection lines.

The plurality of first connection lines may include a first sub connection line extending in a first direction and a second sub connection line extending in a second direction, the plurality of second connection lines may include a third sub connection line extending in the first direction and a fourth sub connection line extending in the second direction, the plurality of third connection lines may include a fifth sub connection line extending in the first direction and a sixth sub connection line extending in the second direction, the first sub connection line, the third sub connection line, and the fifth sub connection line may be connected to each other, and the second sub connection line, the fourth sub connection line, and the sixth sub connection line may be connected to each other.

The stretchable display device may further comprise an insulating layer disposed between the third sub connection line and the fourth sub connection line in an overlapping area of the third sub connection line and the fourth sub connection line.

The stretchable display device may further comprise an organic protection layer which overlaps an overlapping area of the third sub connection line and the fourth sub connection line.

The stretchable display device is implemented to be stretched in the second direction and a length of the second direction of each of the plurality of grip areas is longer than a length of the first direction.

A ductile breaking rate of the sixth sub connection line may be higher than a ductile breaking rate of the fifth sub connection line.

A radius of curvature of the plurality of third connection lines may be smaller than a radius of curvature of the plurality of first connection lines.

An amplitude of the plurality of third connection lines may be larger than an amplitude of the plurality of first connection lines.

A width of the plurality of third connection lines may be narrower than a width of the plurality of first connection lines.

The stretchable display device may further comprise at least one of a first rigid layer disposed above the plurality of base substrates and a second rigid layer disposed below the plurality of base substrates.

Each of a modulus of the first rigid layer and a modulus of the second rigid layer may be higher than a modulus of the lower substrate.

Each of the first rigid layer and the second rigid layer may be formed of the same or substantially the same material as the lower substrate and each of a degree of polymerization of the first rigid layer and a degree of polymerization of the second rigid layer is higher than a degree of polymerization of the lower substrate.

The one base substrate is disposed in each of the plurality of grip areas.

Each of the plurality of pixels may be divided into a plurality of sub pixels by a bank, and the bank is configured by any one of a transparent insulating material, a black material, a transparent carbon-based mixture, and carbon black.

An outer peripheral area adjacent to the display area may be further defined in the lower substrate and an outer peripheral substrate which is larger than the pixel substrate is disposed in the outer peripheral area.

According to another aspect of the present disclosure, a stretchable display device may include a soft substrate in which a display area including a plurality of pixels, a plurality of grip areas in which a clamp is contacted, and a plurality of buffer areas which encloses each of the plurality of grip areas are defined; at least one rigid substrate which is disposed in each of the plurality of grip areas; and at least one rigid layer which overlaps at least one rigid substrate.

A modulus of the at least one rigid layer may be higher than a modulus of the soft substrate.

The at least one rigid layer may be formed of the same or substantially the same material as the soft substrate and a degree of polymerization of the at least one rigid layer is higher than a degree of polymerization of the soft substrate.

The stretchable display device may further comprise a plurality of first connection lines disposed in the display area; and a plurality of third connection lines which is disposed in the buffer area and has a ductile breaking rate higher than that of the plurality of first connection lines.

A radius of curvature of the plurality of third connection lines may be smaller than a radius of curvature of the plurality of first connection lines.

An amplitude of the plurality of third connection lines may be larger than an amplitude of the plurality of first connection lines.

A width of the plurality of third connection lines is narrower than a width of the plurality of first connection lines.

Each of the plurality of pixels is divided into a plurality of sub pixels by a bank, and the bank is configured by any one of a transparent insulating material, a black material, a transparent carbon-based mixture, and carbon black.

An outer peripheral area which encloses the display area may be further defined in the soft substrate, a pixel substrate in which the plurality of pixels is formed may be disposed in the display area, and an outer peripheral substrate which may be larger than the pixel substrate is disposed in the outer peripheral area.

According to still another aspect of the present disclosure, a stretchable display device may include a lower substrate in which a display area including a plurality of pixels, a non-display area adjacent to the display area, and a grip area are defined; in which the grip area overlaps the display area and a part of the non-display area and in the grip area, at least one base substrate and at least one rigid layer which overlaps the base substrate are included.

The grip area overlaps only the display area.

The grip area overlaps only the non-display area.

The grip area overlaps both the display area and the non-display area.

The stretchable display may further comprise a plurality of first connection lines disposed in the display area; and a plurality of third connection lines which is disposed to be adjacent to the grip area and has a ductile breaking rate higher than that of the plurality of first connection lines.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A stretchable display device, comprising:
   a lower substrate having thereon a display area including a plurality of pixels, a plurality of grip areas, and buffer areas positioned between the display area and the grip areas and adjacent to the plurality of grip areas;
   a plurality of pixel substrates disposed in the display area, each of the pixel substrates being spaced apart from each other and being independently disposed;
   a first base substrate disposed in each of the plurality of grip areas;
   a second base substrate disposed in each of the plurality of grip areas;
   a plurality of first connection lines disposed on each of the plurality of pixel substrates and extending between each of the plurality of pixel substrates in the display area, the plurality of first connection lines connecting the plurality of pixels formed on the plurality of pixel substrates;
   a plurality of second connection lines disposed on the first base substrate and extending between the first base substrate to the second base substrate in each of the plurality of grip areas; and
   a plurality of third connection lines disposed on the lower substrate in the buffer area, the plurality of third connection lines connecting the plurality of first connection lines and the plurality of second connection lines to each other, and having a ductile breaking rate higher than that of the plurality of first connection lines,
   wherein the plurality of pixel substrates and the first and second base substrates are laterally spaced from each other do not overlap with each other from a plan view.

2. The stretchable display device according to claim 1,
   wherein the plurality of first connection lines includes a first sub connection line extending in a first direction and a second sub connection line extending in a second direction,
   the plurality of second connection lines includes a third sub connection line extending in the first direction and a fourth sub connection line extending in the second direction,
   the plurality of third connection lines includes a fifth sub connection line extending in the first direction and a sixth sub connection line extending in the second direction,
   the first sub connection line, the third sub connection line, and the fifth sub connection line are connected to each other, and
   the second sub connection line, the fourth sub connection line, and the sixth sub connection line are connected to each other.

3. The stretchable display device according to claim 2, further comprising:
   an insulating layer disposed between the third sub connection line and the fourth sub connection line in an overlapping area of the third sub connection line and the fourth sub connection line.

4. The stretchable display device according to claim 2, further comprising:
   an organic protection layer which overlaps an overlapping area of the third sub connection line and the fourth sub connection line.

5. The stretchable display device according to claim 2, wherein the stretchable display device is implemented to be stretched in the second direction and a length of the second direction of each of the plurality of grip areas is longer than a length of the first direction.

6. The stretchable display device according to claim 2 wherein a ductile breaking rate of the sixth sub connection line is higher than a ductile breaking rate of the fifth sub connection line.

7. The stretchable display device according to claim 1, wherein a radius of curvature of the plurality of third connection lines is smaller than a radius of curvature of the plurality of first connection lines.

8. The stretchable display device according to claim 1, wherein an amplitude of the plurality of third connection lines is larger than an amplitude of the plurality of first connection lines.

9. The stretchable display device according to claim 1, wherein a width of the plurality of third connection lines is narrower than a width of the plurality of first connection lines.

10. The stretchable display device according to claim 1, further comprising:
at least one of a first rigid layer disposed above the first and second base substrates and a second rigid layer disposed below the first and second base substrates,
wherein a degree of hardness of the first rigid layer and a degree of hardness of the second rigid layer are higher than a degree of hardness of the lower substrate.

11. The stretchable display device according to claim 10, wherein each of a modulus of the first rigid layer and a modulus of the second rigid layer is higher than a modulus of the lower substrate.

12. The stretchable display device according to claim 10, wherein each of the first rigid layer and the second rigid layer is formed of the same or substantially the same material as the lower substrate and each of a degree of polymerization of the first rigid layer, and
a degree of polymerization of the second rigid layer is higher than a degree of polymerization of the lower substrate.

13. The stretchable display device according to claim 1, wherein one base substrate among the first and second base substrates is disposed in each of the plurality of grip areas.

14. The stretchable display device according to claim 1, further comprising a bank, wherein each of the plurality of pixels is divided into a plurality of sub pixels by the bank, and
the bank is configured by any one of a transparent insulating material, a black material, a transparent carbon-based mixture, and carbon black.

15. The stretchable display device according to claim 1, wherein an outer peripheral area adjacent to the display area is in the lower substrate, and
an outer peripheral substrate which is larger than the pixel substrate is disposed in the outer peripheral area.

16. A stretchable display device, comprising:
a lower substrate having thereon a display area including a plurality of pixels, a plurality of grip areas a plurality of buffer areas which encloses each of the plurality of grip areas, and each of the plurality of grip areas in which a clamp is contacted;
at least one base substrate which is disposed on the lower substrate in only each of the plurality of grip areas; and
at least one rigid layer which overlaps the at least one base substrate,
wherein a degree of hardness of the at least one rigid layer is higher than a degree of hardness of the lower substrate, and
wherein the at least one rigid layer is disposed between the lower substrate and the at least one base substrate.

17. The stretchable display device according to claim 16, wherein a modulus of the at least one rigid layer is higher than a modulus of the lower substrate.

18. The stretchable display device according to claim 16, wherein the at least one rigid layer is formed of the same or substantially the same material as the lower substrate, and a degree of polymerization of the at least one rigid layer is higher than a degree of polymerization of the lower substrate.

19. The stretchable display device according to claim 16, further comprising:
a plurality of first connection lines disposed in the display area; and
a plurality of third connection lines disposed in the buffer area, the plurality of third connection lines having a ductile breaking rate higher than that of the plurality of first connection lines.

20. The stretchable display device according to claim 19, wherein a radius of curvature of the plurality of third connection lines is smaller than a radius of curvature of the plurality of first connection lines.

21. The stretchable display device according to claim 16, wherein an amplitude of the plurality of third connection lines is larger than an amplitude of the plurality of first connection lines.

22. The stretchable display device according to claim 16, wherein a width of the plurality of third connection lines is narrower than a width of the plurality of first connection lines.

23. The stretchable display device according to claim 16, further comprising a bank,
wherein each of the plurality of pixels is divided into a plurality of sub pixels by the bank, and the bank is configured by any one of a transparent insulating material, a black material, a transparent carbon-based mixture, and carbon black.

24. The stretchable display device according to claim 16, wherein an outer peripheral area which encloses the display area is further defined in the lower substrate, a pixel substrate in which the plurality of pixels is formed is disposed in the display area, and an outer peripheral substrate which is larger than the pixel substrate is disposed in the outer peripheral area.

25. A stretchable display device, comprising:
a lower substrate having thereon a display area, a non-display area adjacent to the display area, and a grip area;
a plurality of pixels on the display area of the lower substrate;
at least one base substrate on the lower substrate;
at least one rigid layer on the lower substrate;
a plurality of second connection lines disposed in the grip area and including a third sub connection line extending in a first direction and a fourth sub connection line extending in a second direction; and
an insulating layer disposed between the third sub connection line and the fourth sub connection line,
wherein the grip area overlaps at least one of the display area and a part of the non-display area,
wherein in the grip area, the at least one base substrate and the at least one rigid layer overlaps with the base substrate, wherein the at least one rigid layer is disposed between the lower substrate and the at least one base substrate, and wherein the at least one rigid layer is disposed on the lower substrate in direct contact with the lower substrate.

26. The stretchable display device according to claim 25, wherein the grip area overlaps only the display area.

27. The stretchable display device according to claim 25, wherein the grip area overlaps only the non-display area.

28. The stretchable display device according to claim 25, wherein the grip area overlaps both the display area and the non-display area.

29. The stretchable display device according to claim 25, further comprising:

a plurality of first connection lines disposed in the display area; and a plurality of third connection lines which is disposed to be adjacent to the grip area and has a ductile breaking rate higher than that of the plurality of first connection lines.

\* \* \* \* \*